United States Patent
Hol et al.

(10) Patent No.: US 9,927,711 B2
(45) Date of Patent: Mar. 27, 2018

(54) ACTUATION MECHANISM, OPTICAL APPARATUS AND LITHOGRAPHY APPARATUS

(71) Applicant: ASML Netherlands B.V., Veldhoven (NL)

(72) Inventors: Sven Antoin Johan Hol, Veldhoven (NL); Andrea Lodovico Mancuso, Veldhoven (NL); Hendricus Johannes Maria Meijer, Veldhoven (NL); Erik Maria Rekkers, Veldhoven (NL); Marinus Johannes Maria Van Dam, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/105,343

(22) PCT Filed: Dec. 2, 2014

(86) PCT No.: PCT/EP2014/076247
§ 371 (c)(1),
(2) Date: Jun. 16, 2016

(87) PCT Pub. No.: WO2015/104099
PCT Pub. Date: Jul. 16, 2015

(65) Prior Publication Data
US 2016/0313649 A1    Oct. 27, 2016

(30) Foreign Application Priority Data
Jan. 13, 2014  (EP) .................................. 14150933

(51) Int. Cl.
*G03F 7/20*    (2006.01)

(52) U.S. Cl.
CPC ...... *G03F 7/70191* (2013.01); *G03F 7/70758* (2013.01); *G03F 7/70825* (2013.01); *G03F 7/70941* (2013.01)

(58) Field of Classification Search
CPC . G03F 7/70758; G03F 7/70941; H02K 11/01; H02K 41/0352; H02N 15/00
See application file for complete search history.

(56) References Cited

U.S. PATENT DOCUMENTS

2004/0184020 A1  9/2004  Trost
2005/0146698 A1* 7/2005  Hol ..................... G03F 7/70758
                                                                355/53

(Continued)

FOREIGN PATENT DOCUMENTS

JP      2003088088      3/2003
WO   WO 2011/000671    1/2001

OTHER PUBLICATIONS

English-Language Abstract for Japanese Patent Publication No. JP2003088088, published Mar. 20, 2010; 2 pages.

(Continued)

*Primary Examiner* — Steven H Whitesell Gordon
(74) *Attorney, Agent, or Firm* — Sterne, Kessler, Goldstein & Fox P.L.L.C.

(57) ABSTRACT

An actuator to displace, for example a mirror, provides movement with at least two degrees of freedom by varying the currents in two electromagnets (370). A moving part includes a permanent magnet (362) with a magnetic face constrained to move over a working area lying substantially in a first plane perpendicular to a direction of magnetization of the magnet. The electromagnets have pole faces lying substantially in a second plane closely parallel to the first plane, each pole face substantially filling a quadrant of the area traversed by the face of the moving magnet. A ferromagnetic shield (820) is provided around the moving part (Continued)

and has at least one interruption (822) to reduce the influence of adjacent actuators or stray fields while also minimizing attraction between the permanent magnet (362) and the shield (820).

20 Claims, 17 Drawing Sheets

(56) References Cited

U.S. PATENT DOCUMENTS

| | | | |
|---|---|---|---|
| 2008/0169708 A1* | 7/2008 | Shibata | G03B 27/58 310/12.06 |
| 2012/0044474 A1 | 2/2012 | Hauf et al. | |
| 2015/0277233 A1* | 10/2015 | Van Schoot | G02B 7/1821 355/67 |

OTHER PUBLICATIONS

International Search Report and Written Opinion of the International Search Authority directed to related International Patent Application No. PCT/EP2014/076247 , dated Mar. 10, 2015; 10 pages.

International Preliminary Report on Patentability directed to related International Patent Application No. PCT/EP2014/076247, dated Jul. 19, 2016; 7 pages.

\* cited by examiner

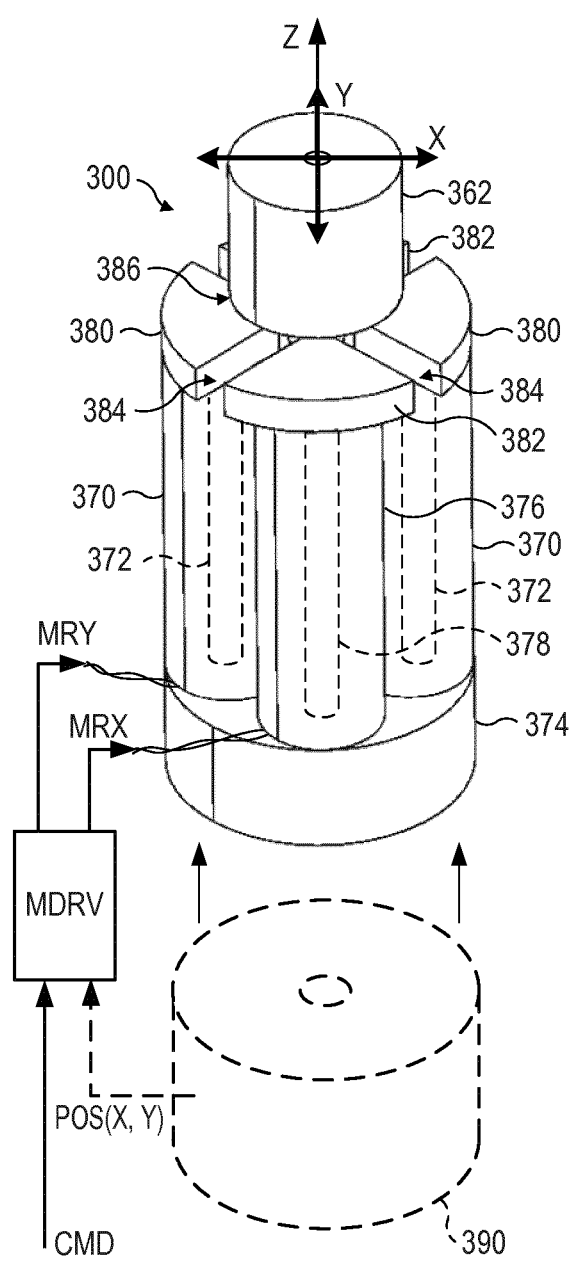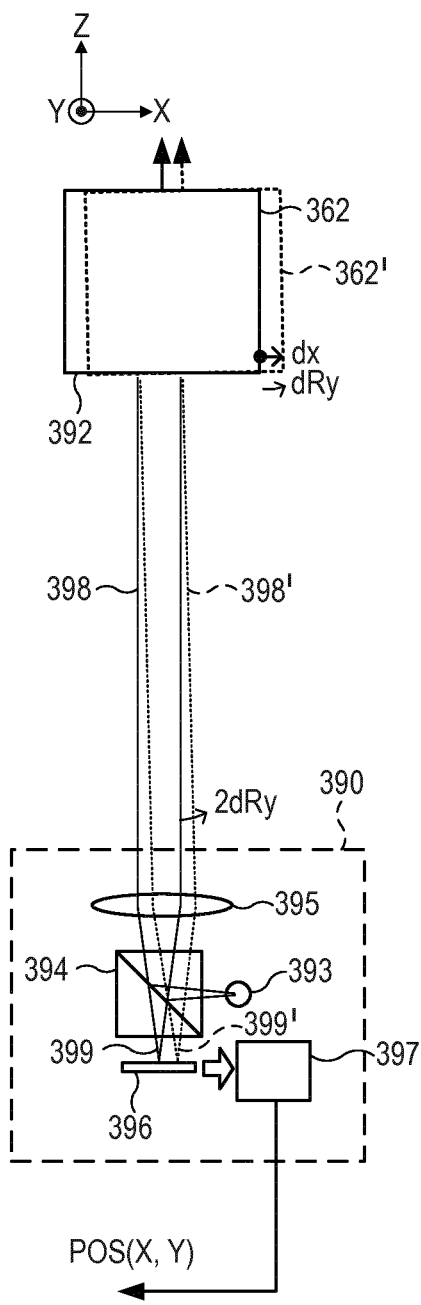

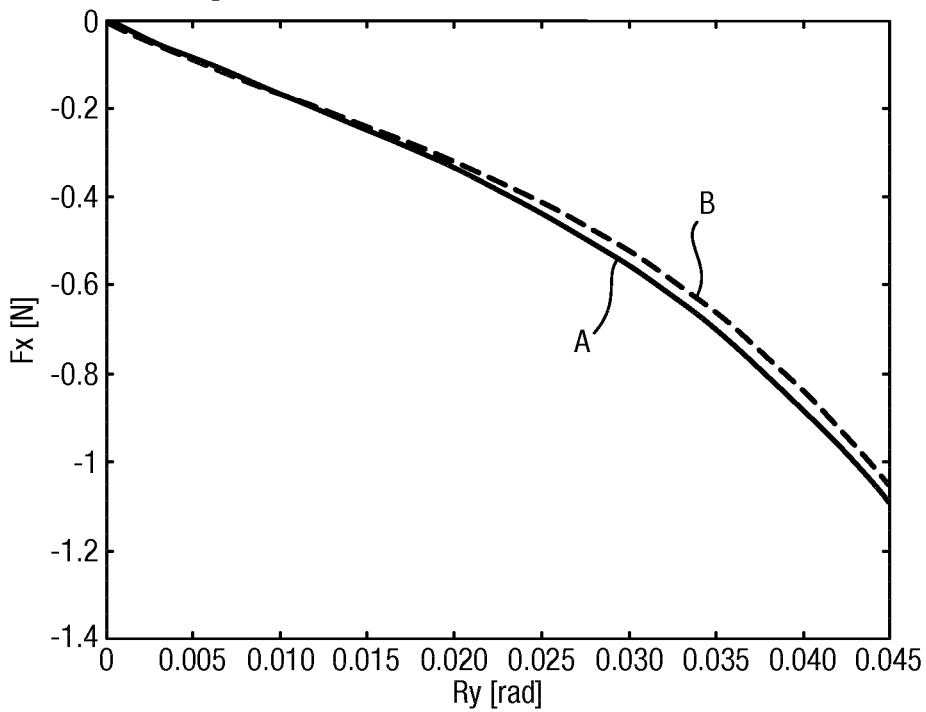
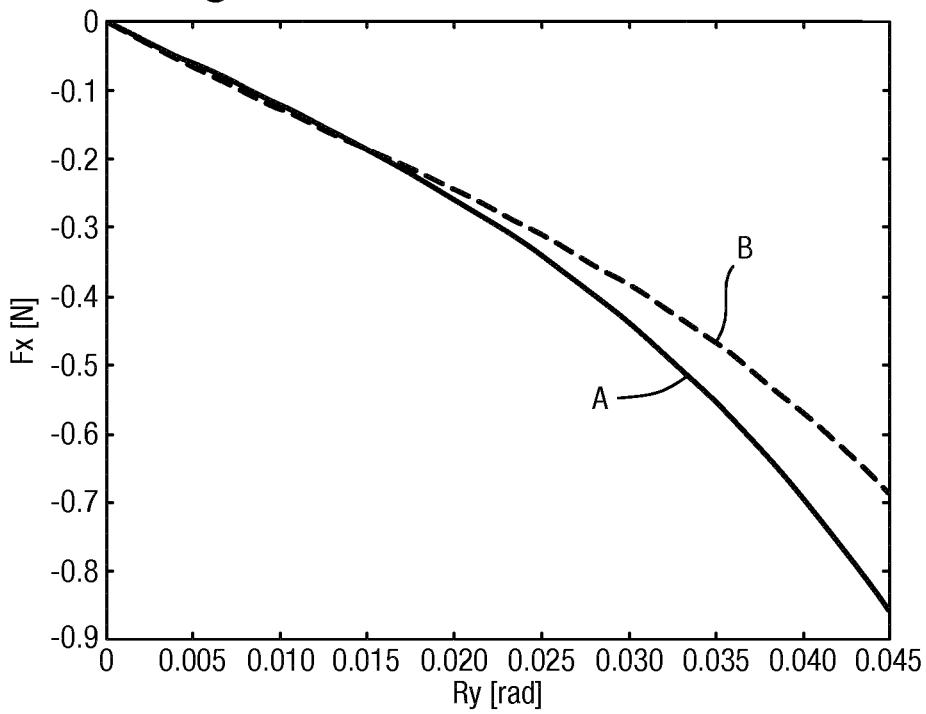

ACTUATION MECHANISM, OPTICAL APPARATUS AND LITHOGRAPHY APPARATUS

This application is related to EP Patent Application No. 14150933.1, filed Jan. 13, 2014, which is incorporated by reference herein in its entirety.

FIELD

An embodiment of the invention relates to actuation mechanisms that may be applied in a range of apparatuses and instruments. An embodiment of the invention relates to an optical system with a faceted field mirror device and/or a faceted pupil mirror device.

BACKGROUND

Lithography is widely recognized as one of the key steps in the manufacture of integrated circuits (ICs) and other devices and/or structures. However, as the dimensions of features made using lithography become smaller, lithography is becoming a more critical factor for enabling miniature IC or other devices and/or structures to be manufactured.

A lithographic apparatus is a machine that applies a desired pattern onto a substrate, usually onto a target portion of the substrate. A lithographic apparatus can be used, for example, in the manufacture of ICs. In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

In a lithographic apparatus, many moving parts are typically provided with various degrees of freedom, and the motions and locations (including linear and angular positions (orientation), velocities and accelerations) are controlled automatically via numerous actuation mechanisms (actuators). Actuators may be electromagnetically, pneumatically, or hydraulically operated. Actuators are often constrained to effect movement in only one degree of freedom (linear or rotational). Where the moving parts are to be controlled in a plurality of degrees of freedom, more complex mechanisms may be provided, or multiple single-degree mechanisms may be combined.

In order to shorten the exposure wavelength and, thus, reduce the minimum printable size, it has been proposed to use an extreme ultraviolet (EUV) radiation source. EUV radiation sources are typically configured to output radiation wavelengths of around 5-20 nm, for example, 13.5 nm or about 13 nm or 6.5-6.8 nm. Use of EUV radiation may constitute a significant step toward achieving small features printing. Such radiation is termed extreme ultraviolet or soft x-ray, and possible sources include, for example, laser-produced plasma sources, discharge plasma sources, or synchrotron radiation from electron storage rings. Because of the desire for extreme accuracy, and because additionally of the desire to work in a vacuum environment with high reliability, designing actuators for EUV lithography apparatus is particularly challenging.

SUMMARY

An example where actuators are used is for a faceted mirror of an illumination system of an EUV optical apparatus. Numerous individual mirror facets may be provided in an array, each of which may need to be oriented in different directions to effect different illumination profiles at a target location. Actuators for field facet mirrors are described, for example, in the PCT patent application publication no. WO 2011/000671 A1. When seeking to extend the range of illumination profiles that can be achieved, actuators having more than two positions are desired, which may include movements in two or more degrees of freedom, and may need intermediate positions that cannot be defined by end stops. Thus, such an actuator is desired, which meets stringent requirements of size, cost and heat dissipation, as well as performance.

Other issues arise in the design of such an illumination system. The position of the moving mirror or other element should be measured in two dimensions, rather than being set in one dimension by, for example, an end stop. When there are potentially hundreds of individual facets to be controlled, and especially when these are in a vacuum environment, providing sufficiently accurate and compact position measurement and feedback control becomes challenging.

According to an aspect of the invention, there is provided an actuation mechanism comprising a moving part and a static part, the moving part including a magnet that is driven to move across a working range by magnetic fields generated by the static part; and a shield surrounding the working range of the magnet to reduce propagation of magnetic fields, the shield being formed of a ferromagnetic material and having therein at least one interruption.

According to an aspect of the invention, there is provided an actuation system comprising a plurality of actuation mechanisms, each as described above.

According to an aspect of the invention, there is provided an optical apparatus comprising a series of optical components arranged to receive a radiation beam from a radiation source to process and deliver the beam to a target location, wherein the optical components include one or more movable optical components coupled to (mounted on) an actuator mechanism as described herein, and wherein a controller and drive circuitry are provided to energize the electromagnets to achieve a desired positioning of the, or each movable optical component.

The movable optical component may form an illumination system to condition the beam and deliver the conditioned beam to a target location on a patterning device, wherein the movable component is movable to vary an incidence angle of the conditioned beam at the target location. In an embodiment, a plurality of such movable components with associated actuation mechanisms are provided as part of a fly's eye illuminator.

Embodiments of the invention may find particular application where the optical components are reflective components and the illumination system is an EUV illumination system operable with radiation with a wavelength in the range 5 to 20 nm.

According to an aspect of the invention, there is provided a lithographic apparatus that includes an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and an optical apparatus as described herein, configured to condition the radiation beam in the illumination system and/or the patterned radiation beam in the projection system.

According to an aspect of the invention, there is provided a device manufacturing method comprising projecting a patterned beam of radiation onto a substrate, wherein the patterned beam is formed from a radiation beam which is conditioned by an optical apparatus as described herein.

Further aspects, features, and potential advantages, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the relevant art(s) to make and use the invention. Embodiments of the invention are described, by way of example only, with reference to the accompanying drawings, in which:

FIG. 7 illustrates the basic form of a novel 2-D planar motor for use in actuation mechanisms according to embodiments of the present invention, with control functions indicated schematically;

FIG. 8 illustrates the form and operation of an optical position sensor that may be used to implement the control functions of FIG. 7;

FIG. 27 shows the position dependency of forces exerted on the mover of the actuator of FIGS. 23(a) and 23(b) for two different positions of the mover of an adjacent actuator;

FIG. 28 shows the position dependency forces on the mover of the actuator of FIGS. 24(a) and 24(b) for two different positions of the mover of an adjacent actuator;

DETAILED DESCRIPTION

Embodiments of the present invention concern an actuation mechanism that may be deployed in a wide range of applications. In an example application, actuation mechanisms may be provided to move various components within a lithographic apparatus. The components may be optical components, and may for example be EUV optical components. Actuators deployed within such apparatus may have to meet stringent environmental and performance criteria. For example, it may be desirable to avoid friction between parts to avoid the need for lubricants and/or to avoid generating wear particles. An EUV apparatus typically includes a near-vacuum environment, so that an outgassing material such as a lubricant may not be tolerated. Low heat dissipation may be a consideration. There will be described below a novel type of actuation mechanism that can help meet one or more of these stringent criteria. Before describing the actuator, some examples of EUV lithographic apparatus will be introduced. Further below, an example of how the actuator may be deployed will be described. It will be understood, however, that embodiments of the invention of the actuator are widely applicable and not at all limited to use in lithographic apparatus in general, or EUV lithographic apparatus in particular.

Figure 1:
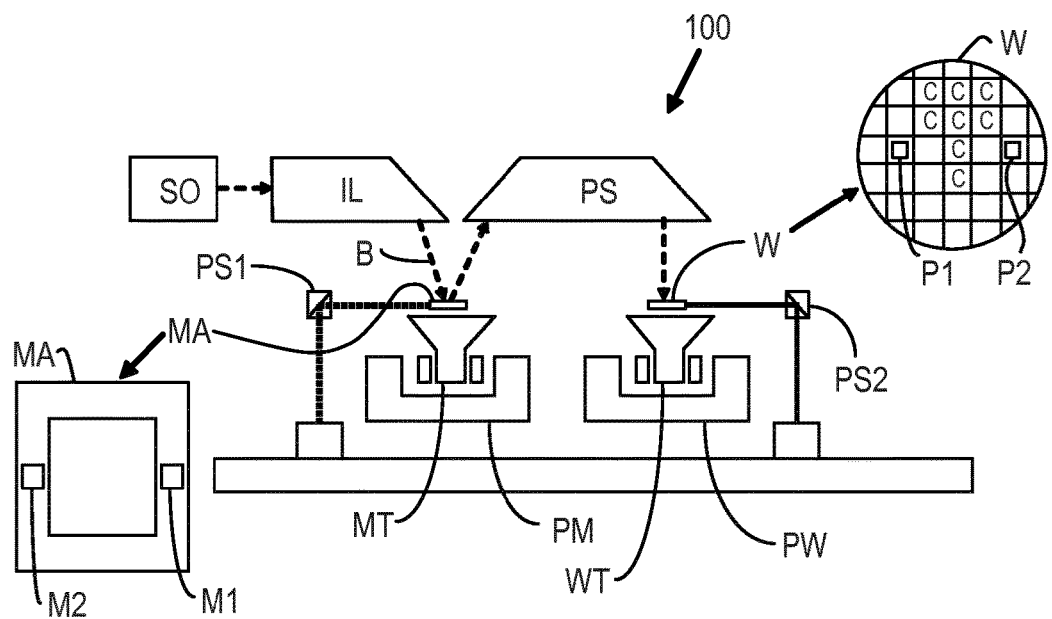
FIG. 1 depicts schematically a lithographic apparatus having reflective optics according to embodiments of the invention.

FIG. 1 schematically depicts a lithographic apparatus 100 including a source collector module SO according to an embodiment of the invention. The apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desirable to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the desired plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as faceted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
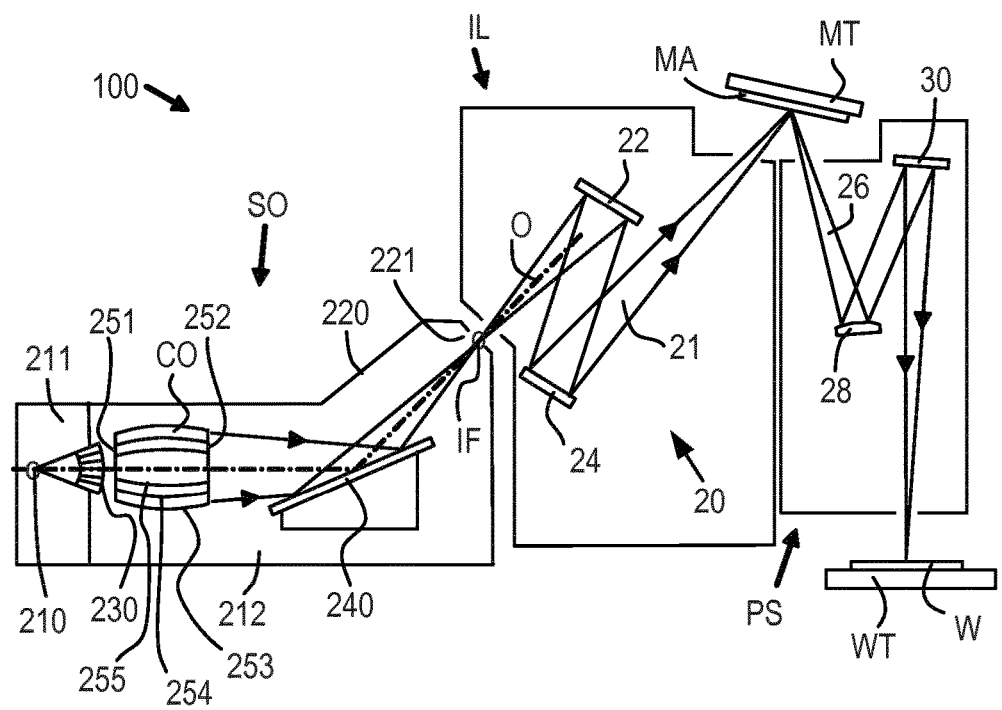
FIG. 2 is a more detailed view of the apparatus of FIG. 1.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be needed for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein may at least include a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral purity filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a faceted field mirror device 22 and a faceted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is desirably used in combination with a discharge produced plasma source, often called a DPP source.

Figure 3:
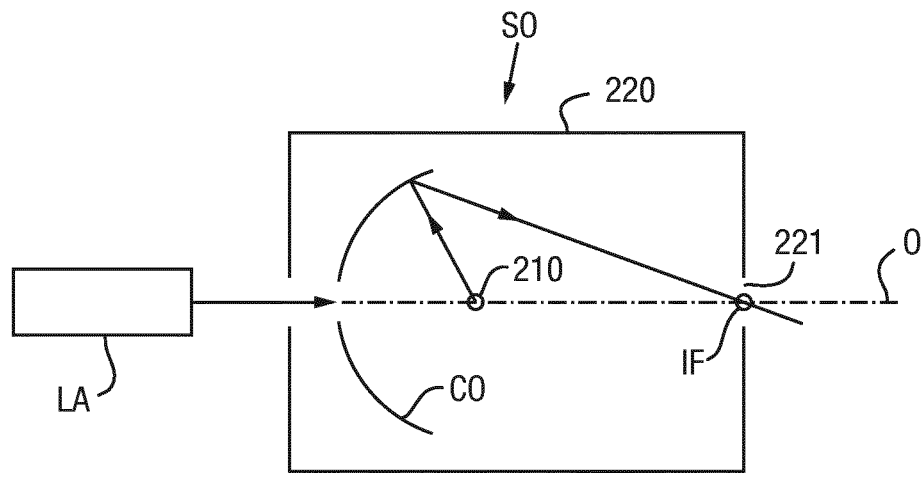
FIG. 3 is a more detailed view of an embodiment of a source collector module for the apparatus of FIGS. 1 and 2.

In an embodiment, the source collector module SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Figure 4:
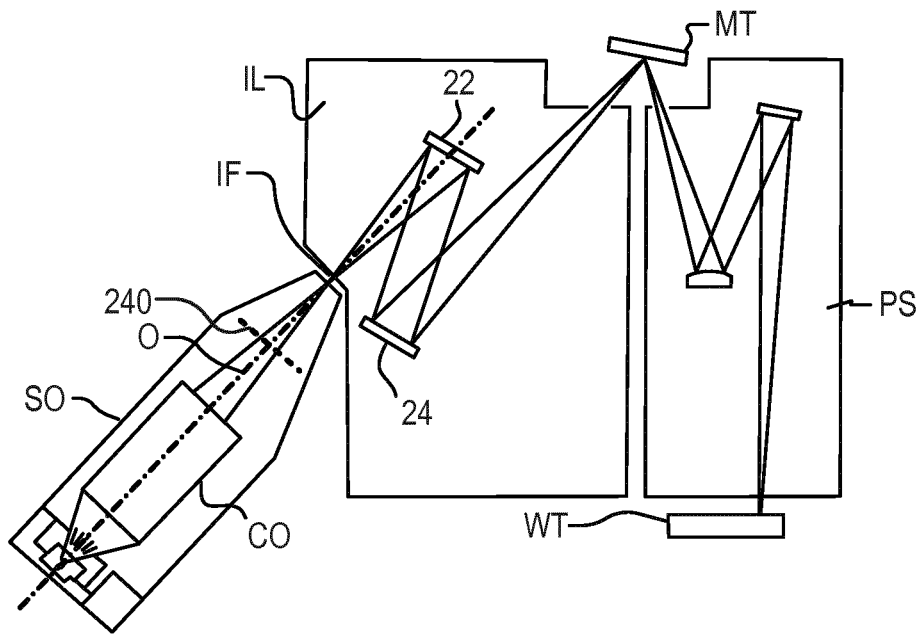
FIG. 4 depicts an EUV lithographic apparatus according to embodiments of the invention.

FIG. 4 shows an alternative arrangement for an EUV lithographic apparatus in which the spectral purity filter 240 is of a transmissive type, rather than a reflective grating. The radiation from source collector module SO in this case follows a straight path from the collector optic to the intermediate focus IF (virtual source point). Note that positioning the filter close to or at the IF will lead to very high absorbed power densities. The high temperatures that result may degrade the filter. On the other hand, the filter area can be small, which is an advantage. In alternative embodiments, not shown, the spectral purity filter 240 may be positioned at the virtual source point IF or at any point between the collector optic CO and the virtual source point IF. The filter can be placed at other locations in the radiation path, for example downstream of the virtual source point IF. Multiple filters can be deployed. As in the previous examples, the collector optic CO may be of the grazing incidence type (FIG. 2) or of the direct reflector type (FIG. 3). The spectral purity filter may be designed to suppress unwanted radiation in the infrared wave band, leaving DUV radiation to be suppressed by other means.

The following description presents optical apparatus and methods that can condition a radiation beam being directed at a target location on an object. The object can be, for example, a lithographic patterning device MA for generating a circuit pattern to be formed on an individual layer in an integrated circuit, or a substrate W on a substrate table WT of a lithographic apparatus. The target location may be an area of the patterning device MA illuminated by the illumination system IL. Example patterning devices include a mask, a reticle, or a dynamic patterning device. The reticles can also be for use within any lithography process, while the emphasis in this application will be on EUV lithography. Within the illumination system, actuators are used to move reflective elements so as to select different illumination modes.

Figure 5:
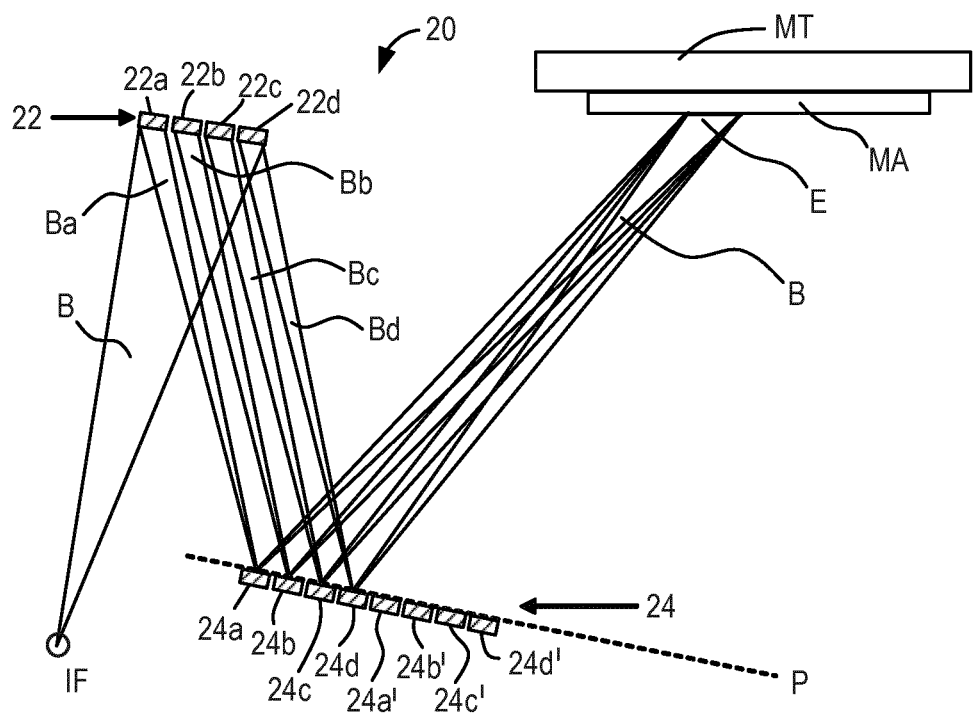
FIG. 5 is a first cross sectional view of part of an illumination system of a lithographic apparatus in which an actuation mechanism according to an embodiment of the invention may be used.

FIG. 5 schematically shows a cross sectional view of an exemplary optical apparatus 20 to condition a radiation beam in the illumination system IL of a lithographic apparatus of the type shown in FIGS. 1 to 4. Apparatus 20 includes a first reflective component 22 in the form of a faceted field mirror device 22 and a second reflective component 24 in the form of a faceted pupil mirror device 24. Faceted field mirror device 22 comprises a plurality of primary reflective elements, some particular ones schematically indicated in FIG. 5 and referred to as field facet mirrors 22a, 22b, 22c and 22d. The second reflective component 24 comprises a plurality of secondary reflective elements including, for example, the particular secondary reflective elements referred to as pupil facet mirrors 24a, 24b, 24c, 24d, and 24a', 24b', 24c', 24d'.

Generally, the field facet mirrors 22a-d direct respective parts of incoming radiation beam B towards the pupil facet mirrors 24a-d, 24a'-d'. Although only four field facet mirrors 22a-d are shown, any number of field facet mirrors may be provided. The field facet mirrors may be arranged in a generally two-dimensional array, which does not mean that they should lie strictly in a flat plane. Although only eight pupil facet mirrors 24a-d, 24a'-d' are shown, any number of pupil facet mirrors may be provided, the number being typically a multiple of the number of field facet mirrors. The pupil facet mirrors may be arranged in a two-dimensional array. The shapes and configurations of the field facet mirrors and pupil facet mirrors may be square, rectangular, circular, or more complicated in shape, according to design.

Each field facet mirror 22a-d reflects a portion of the radiation beam B received by the first reflective component (22) in the form of a sub-beam of radiation towards a different pupil facet mirror 24a-d of the pupil mirror device 24. For example, a first sub-beam Ba is directed by a first field facet mirror 22a to a first pupil facet mirror 24a. Second, third and fourth sub-beams Bb, Bc and Bd are directed by second, third and fourth field facet mirrors 22b, 22c, and 22d respectively to second, third and fourth pupil facet mirrors 24b, 24c, and 24d. The spatial intensity distribution of the radiation beam B at the pupil mirror device 24 can define an illumination mode of the lithographic apparatus. In one embodiment, the field facet mirrors 22a-d have adjustable orientations and may be used with different ones of the pupil facet mirrors 24a-d, 24a'-d', to form different spatial intensity distributions at the pupil plane P, thereby providing different illumination modes. This arrangement will be described later with reference to FIG. 6. The pupil facet mirrors 24a-d may be adjustable in orientation.

Each of the field facet mirrors 22a-d is shaped so as to form an image of the intermediate focus IF at a different pupil facet mirror 24a-d, of the pupil mirror device 24. In practice, the intermediate focus IF will be a virtual image of the plasma source, the image having a finite diameter (e.g. 4-6 mm). Consequently, each field facet mirror 22a-d will form an image of the virtual source point IF, which has a finite diameter (e.g. 3-5 mm) at the pupil facet mirrors 24a-d. The pupil facet mirrors 24a-d, may each have a diameter that is larger than the aforementioned image diameter (to avoid radiation falling between pupil facet mirrors and thereby being lost). The intermediate focus IF and images of the intermediate focus IF are shown as points in the figures for ease of illustration only.

The faceted mirror devices 22 and 24 together form a so-called "fly's eye" illuminator, by which non-uniformities present in the radiation source are eliminated to illuminate area E with more even distribution, and with more control. Each one of the pupil facet mirrors 24a-d may form an image of its associated field facet mirror 22a-d at or near the field plane wherein the patterning device MA is located during exposure of a substrate. These images are substantially overlapping and together form an illumination area E. As a result, a spatially non-uniform intensity distribution in a cross section of the radiation B as emanating from the source SO and received by the optical apparatus 20 is conditioned to have a substantially spatially uniform intensity distribution in the illumination area E. The shape of the illumination area E is determined by the shape of the field facet mirrors 22a-d. In a scanning lithographic apparatus, the illumination area E may for example be a rectangle or a curved band, when viewed in two dimensions which in the scanning direction has a width narrower than the width in a direction perpendicular to the scanning direction.

A wavelength of the desired part of radiation may be an EUV wavelength in the range 5-20 nm, for example 13.5 nm. The beam B may also include large amounts of unwanted radiation, for example at DUV wavelengths. Other patent publications disclose techniques for reducing the transmission of unwanted radiation through the illuminator.

Figure 6:
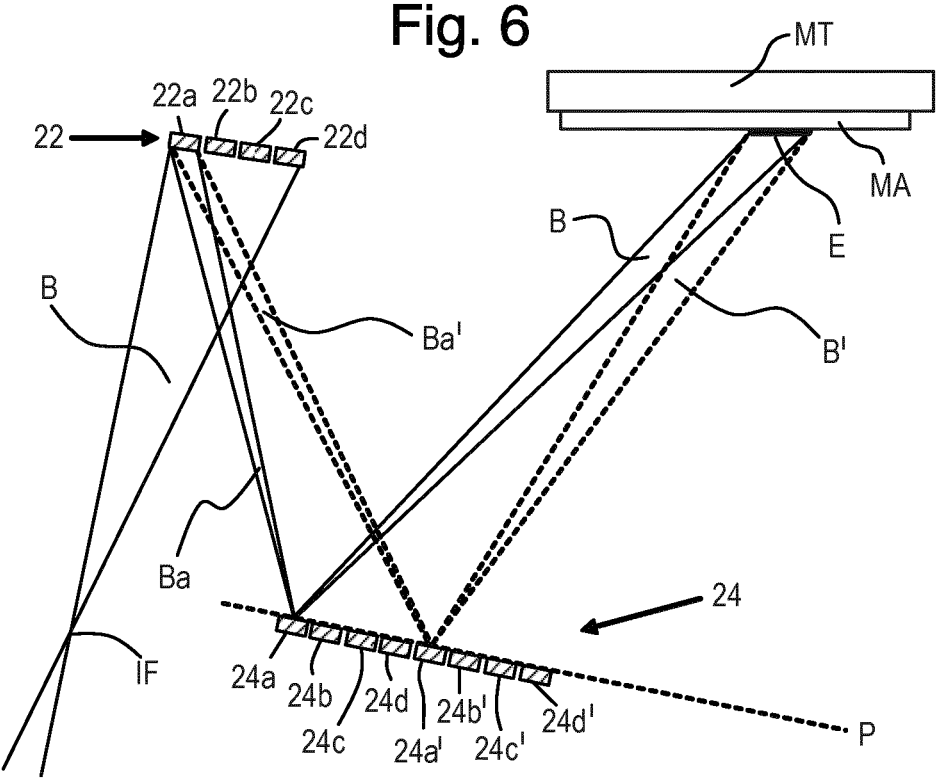
FIG. 6 is a second cross sectional view of the apparatus of FIG. 5 showing adjustment of a field facet mirror to address two associated pupil facet mirrors.

As mentioned already, each field facet mirror 22a-d of field mirror device 22 may have more than one associated pupil facet mirror of pupil mirror device 24. A field facet mirror of field mirror device 22 can be controlled to cooperate with different ones of its associated pupil facet mirrors at different times. For example, as shown in FIG. 6, field facet mirror 22a has two associated pupil facet mirrors 24a and 24a'. These are used in different illumination modes of illuminator 20 (the illuminator being an example of an optical apparatus 20). Field facet mirror 22a may thus be controlled in a second mode to direction EUV radiation towards pupil facet mirror 24a' instead of 24a, while radiation with an undesired wavelength, such as DUV radiation may be scattered to fall onto neighboring pupil facet mirrors like 24c, 24d, 24b' or 24c'.

A novel 2-D motor part for an actuator according to embodiments of the invention will be described hereafter. This motor can be applied in actuators to drive the field facet mirrors or other movable elements in, for example, an EUV system. The same principles of motor and actuator can be applied in other optical applications and in other applications generally. It has generally been sufficient to provide two operating positions, for example, to effect the two illumination modes illustrated in FIG. 6. To provide a greater number of illumination modes, without sacrificing unduly the available radiation, actuators with more than two positions are desired. By providing an actuator with two rotational degrees of freedom, a far greater number of positions can be addressed, thereby resulting in more useful illumination settings.

In PCT patent application publication no. WO 2011/000671 A1, for example, bimetallic strips are used to apply actuating forces directly to an actuator rod. Another example might be piezoelectric motors. These types of motor mechanism may have some problematic implementation characteristics. For instance a bimetallic motor may be slow (or may generate too much heat), the piezoelectric motor may be complex and may need a complex driving power amplifier. The principle of magnetic actuation is attractive, because magnetic coupling can be applied from outside the vacuum environment associated with an EUV system. The magnetic coupling can provide thermal isolation. Examples of actuators using magnetic coupling will be described in more detail below.

FIG. 7 shows the main elements of a motor 300 to provide controllable forces and displacement in at least two-dimensions. A primary moving part comprises permanent magnet 362. The magnet is attached to a moving part of the suspension (not shown in FIG. 7). The moving part including magnet 362 is coupled to a fixed part of the suspension arrangement such that the magnet is free to move in both the x and y directions, as indicated. The suspension arrangement may be such as to bias the moving part toward the central position indicated when the motor is not energized. At the same time, the magnet is constrained to move in the z direction. In the example of an actuator to tilt a mirror in an optical apparatus, the z constraint is provided in the form of a pivot or virtual pivot. Examples of such suspension will be illustrated further below. For the present description, it is sufficient to note that displacement dx of magnet 362 translates into a desired tilting motion dRy of the moving part of the actuator. Similarly a displacement dy into the page is sufficient to effect a tilt dRx about the X axis about the same pivot point. The pivot points need not be coincident, though they are in this example. Assuming that the distance to the pivot point is much greater than the range of movement of the magnet, the magnet can be considered to be moving substantially over an area within a plane.

To effect movement of the moving part in a controllable manner, a static portion of the 2-D motor 300 comprises at least two bipolar electromagnets. A first bipolar electromagnet is formed by coils 370 on ferromagnetic cores 372 (inside the coils, shown in broken likes). Proximal ends of cores 372 are connected to one another via a ferromagnetic core base 374. A second bipolar electromagnet is formed by a second pair of coils 376 arranged orthogonally to the coils 370, on ferromagnetic cores 378. Only one of the coils 376 is visible in FIG. 7, with the other one being behind. Proximal ends of cores 378 are connected to one another via the same ferromagnetic core base 374. In an embodiment, the cores of each electromagnet may be connected together, but not connected to the cores of the other electromagnet.

Distal ends of cores 372 are positioned close to the moving magnet 362, spaced in the X direction either side of a central Z axis. In this example, the cores 372 are provided at their distal ends with ferromagnetic pole shoes 380. Similarly, cores 378 are provided at their distal ends with pole shoes 382. Each pole shoe provides a pole face that is generally flat and substantially fills a sector of, for example, a circle around the axis; the pole shoes may form a different shape than a circle. In this example, the circle filled by the pole faces extends to a radius equal or greater than the maximum desired excursion of the moving magnet 362. Gaps 384, etc. are used between the adjacent pole shoes so that the pole shoes are not connected pieces of ferromagnetic material. The gaps may be filled with non-magnetic spacer material to help prevent the pole shoes from touching. The aim of the design is to fill the circle as completely as possible, and each gap may be less than 10%, optionally 5% of the circle diameter. As there are four core ends with pole shoes, the sectors in this example are quadrants. In principle, a different number of electromagnets and pole shoes may be provided, but four is sufficient to provide two dimensional actuation, as will be explained in further detail below.

The circle defined by the pole faces may further be provided with an opening at its center, so that each face is a sector of an annulus, rather than a complete circle. The opening is to provide access for an optical position sensor, and should be only as large as necessary for this purpose, to avoid reducing the motor's force. In the examples illustrated, the radius of the central opening is less than 25%, optionally less than 20% or 15% of the radius of the circle.

For improved efficiency of the motor, the gap 386 in the longitudinal (z) direction between magnet 362 and pole shoes 380, 382 is made small relative to the width (e.g. diameter) of the side of the magnet that is facing the pole shoes. This side, which may be referred to as the magnetic face of magnet 362 may be, for example, between 5 mm or 7 mm and 10 mm in width, while the gap is between 0.5 and 1.5 mm. The gap may thus be less than 20%, less than 15% or even less than 10% of the width of the magnet face. Practical considerations may restrict how small the gap can be made, however. For example, an advantage of this type of motor may be that the electromagnets and moving magnet can be in different atmospheric compartments, separated from one another by a barrier. This will be illustrated in the examples that follow. The gap in such a case should allow for the thickness of the barrier.

In a case where the pole faces of the electromagnets lie in a plane, the magnet 362 swinging about its pivot point away from the central position will move slightly away from the pole faces, increasing the gap 386. In other words, the magnet swings through a curved surface, not strictly a flat plane. Assuming that the range of movement dx, dy of the magnet is many times smaller than the distance to its pivot point, then this increase in the gap may be insignificant. The curved surface can be treated as a plane for practical purposes. The gap 386 is thus defined between a first plane in which the magnet's lower face moves, and a second plane in which lie the pole faces (defined as the surfaces of the pole shoes 380, 382 that face the moving magnet).

However, in a case where the angle of tilt is substantial, and/or the gap 386 at the central position is particularly small, the gap may increase more significantly as the magnet moves toward its extreme positions. To counteract this effect, the faces of the pole shoes can be shaped or angled so as to define a surface that is not perfectly flat, but rather dished. In that case, the gap between the magnet and the pole faces, and hence the strength of magnetic coupling can be made fairly constant even with large tilt angles, and the motor force can be maintained across the operating range of the motor.

Needless to say, an embodiment with the pole faces lying in a plane may be easier to manufacture. This is particularly a consideration when a large number of actuators are to be arrayed together, as in the examples illustrated below.

Electric currents can be passed through coils 370 to energize the first electromagnet and attract the moving magnet away from its central position illustrated, in either a positive or negative direction along the X axis. For example, if the magnet 362 is oriented with its north pole facing the pole faces, it will be attracted to move over whichever pole face becomes a south pole as a result of the applied current. By controlling the polarity (direction) of the current, one can control the direction of the force applied to the moving magnet. By controlling the magnitude of the current, one can control the magnitude of the force. Thus it is possible to use coils 370 achieve a displacement dx and hence rotation (tilt) dRy of the actuator moving part to which the magnet 362 is attached. In a similar way, the coils 376 can be used to impart a displacement dy to the magnet 362, and hence effect a tilt dRx of the actuator moving part about the X axis. The coils 370 can be energized in unison by connecting them electrically in series. Independent driving of the coils, and different arrangements of coils, are of course possible. Drive circuitry MDRV is provided to generate drive signals (currents) MRY for the coils 370 and MRX for the coils 376 in response to command signals CMD received from a controller (not shown).

Since the drive signals MRY and MRX can be applied to energize the coils 370 and 376 simultaneously, and since the strength of each signal can be controlled, it is in principle possible to apply a force of a desired strength in any direction around the axis. Furthermore, by proper design and placement of the pole faces and the magnet 362, the position may be controllable in X and Y directions quite independently. While known actuators may define two or three operating positions very precisely with end stops, this is impractical when a larger number of operating positions are desired. In principle, the force and resulting displacement are correlated with the drive currents of the coils. However, this correlation is not well-enough defined and constant enough to be relied upon under all operating conditions. For instance, temperature fluctuations may affect the strength of magnet 362 and thereby the tilts. Consequently, a feedback control loop may be implemented, using a position signal POS, illustrated by the dotted input in FIG. 7. This position signal may be obtained for example by an optical sensor which reflects one or more beams of radiation from reflective surfaces somewhere on the moving part within the actuator. In the embodiment illustrated, an optical position sensor 390 can be fitted at the back side of the pole base 374. Pole base 374 and pole shoes 380, 382 provide apertures around the axis of the motor, through which sensor 390 can 'see' the base of the moving magnet 362. Various optical techniques can be used to obtain a two-dimensional value for the position of the magnet.

FIG. 8 illustrates a possible embodiment of an optical position sensor 390, based on an autocollimator design. The moving magnet 362 is illustrated at the top of the diagram, and has a reflective surface 392 (mirror) on its side facing the sensor. The coils and cores are omitted for clarity. Sensor 390 comprises a point radiation outlet 393 (connected or connectable to or comprising a radiation source such as a laser or LED), a beam splitter 394, a focusing optic 395, a multi-element photodetector 396 and processing unit 397.

In operation, focusing optic 395 forms an image 399 of radiation output 393 on the surface of photodetector 396, using a beam 398 of radiation reflected from a mirror surface 392 on the moving magnet 362. Photodetector 396 can detect the position of the image. The photodetector may be a 2-D pixel array of a resolution appropriate to the resolution positional information. Also a PSD (position sensitive device) can be used, which provides the position of the center of gravity of the radiation spot falling on the PSD. The elements of sensor 390 are aligned so that the image 399 is at least approximately centrally positioned on photodetector 396, when the magnet 362 is at its central position. When a displacement dx is applied to move the magnet to position 362', shown dotted, the magnet 362 also tilts through angle dRy as described already. Beam 398 is thus reflected with an angular deviation to follow the path 398'. The deviation of the beam causes a displaced image 399' to be formed somewhere away from the center of detector. If the magnet tilts in two dimensions, the image 399' will be displaced in two dimensions.

Processing unit 397 receives signals from detector 396 and calculates the co-ordinates of the image position, for example in x and y co-ordinates. These can be used as an indication of the angular displacements dRy and dRx of the moving magnet 362, and hence the current angular position of the actuator. A position signal POS(X,Y) is thus made available to allow motor drive unit to implement servo control of the motor to achieve and maintain any position commanded by signal CMD. Moreover, to the extent that the motor design achieves independent actuation in the x and y directions by the respective drive signals MRY, MRX, control loops for X and Y can be implemented independently in a simple manner. The functions of processing unit 397 can be implemented in common processing hardware with other processing functions including the servo control, if desired.

In a case where mirror surface 392 is flat, the angular deviation of beam 398 will be twice the angular displacement of the magnet 362. For example, deviation 2dRy is marked on the diagram, for a mirror displacement angle Ry. The mirror surface need not be flat, however, and can be deliberately curved to achieve a desired combination of sensitivity and compactness in the position sensor. In particular, one can make the mirror surface spherical and convex such that the reflection angle reduces to a value less than 2dRy. The radius of curvature of the convex mirror in fact determines the proportionality constant between dRx,y of the moving magnet and the displacement dx,y of the radiation spot on the detector 396. Thus a more convex shape leads to smaller excursions of the spot and enables a smaller opening between the four coils, and especially a smaller aperture in the pole base 374. A penalty for this is potentially a lower resolution in the position measurement, but this lower resolution may be acceptable.

Note that an optical sensor is mentioned only as one option, and various types of optical sensors, encoders and the like may be envisaged, as well as sensors based on magnetism, for example.

Figure 9:
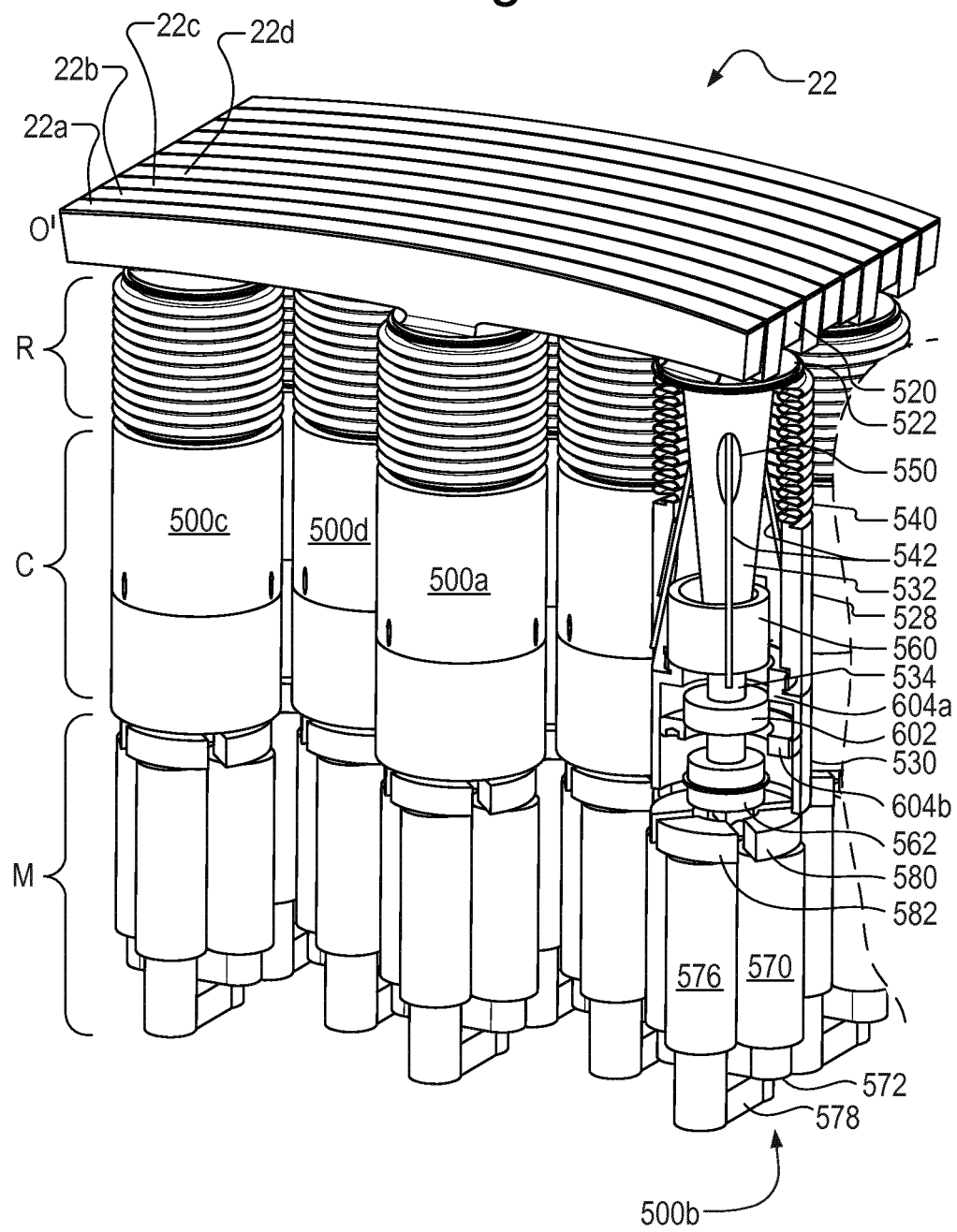
FIG. 9 is an external and partially cut away view of a field facet mirror module in a lithographic apparatus, the field facet mirror module including a number of actuation mechanisms according to an embodiment of the present invention.
Figure 10:
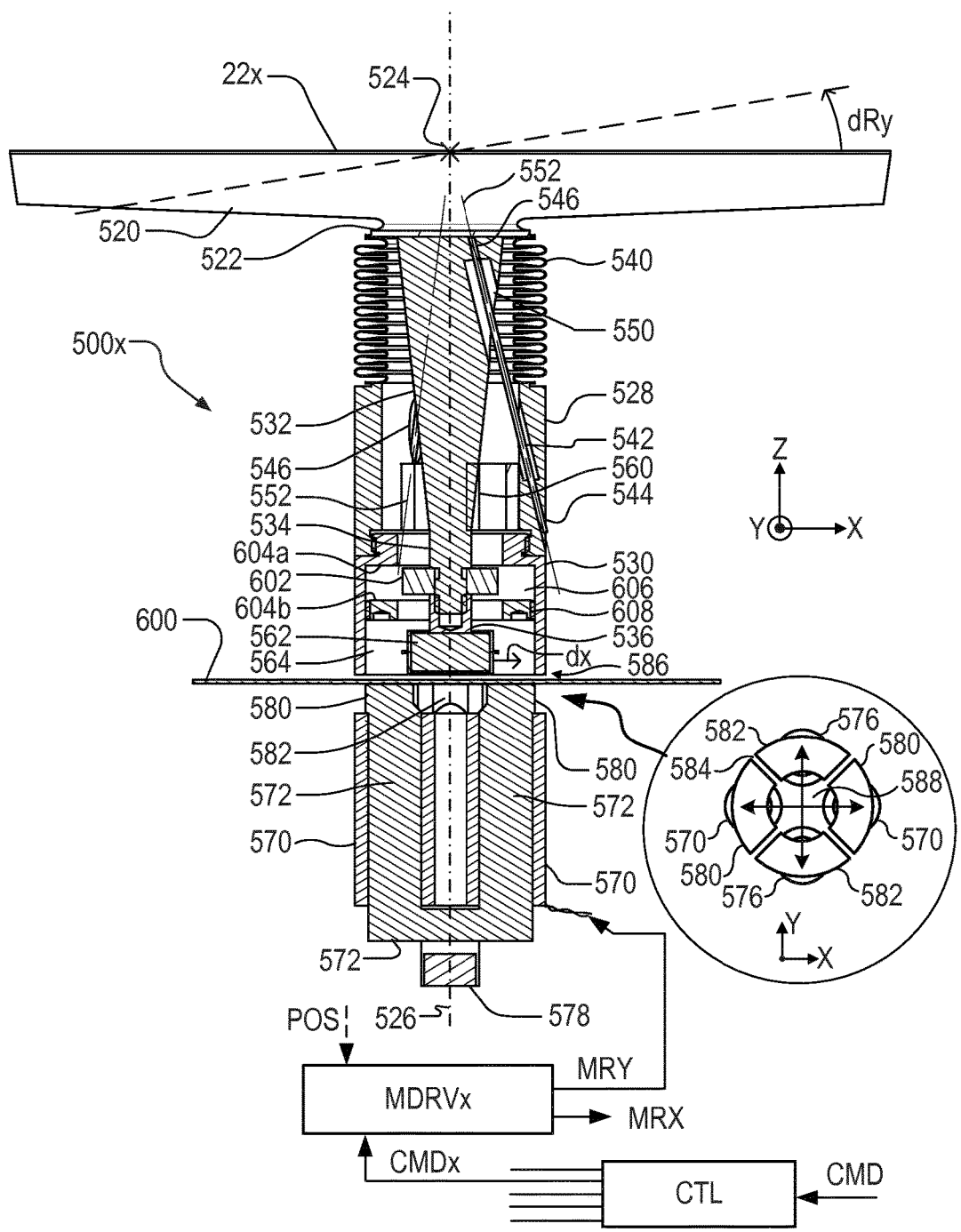
FIG. 10 is a cross sectional view of one actuation mechanism in the mirror module of FIG. 9.

FIGS. 9 and 10 illustrate a practical embodiment in which several actuators including motors of the general type shown in FIG. 7 are applied to effect movement of reflecting elements serving as field facet mirrors 22a to 22d, etc. in the illumination system of an EUV apparatus such as the ones described above. FIG. 9 illustrates a perspective view of a faceted field mirror sub-assembly having ten moveable elements 22a, etc., each mounted on an individual actuator 500a-d, etc. The actuator 500b connected to element 22b is shown cut away, with individual parts labeled. FIG. 10 illustrates a generic element 22x mounted on the head of an actuator 500x. The same reference signs are used for the parts of the actuator and the reflective element in both FIGS. 9 and 10, and both Figures can be referred to when reading the following description. For ease of interpretation, the reflective surfaces are shown facing upward in the diagram. As is seen in FIGS. 1 to 6, the faceted field mirror 22 and its reflective elements in fact may face generally downwards towards the ground. This need not be the case in other apparatus, for lithography or other purposes. References to up and down directions, and terms such as "above" and "below" in the description of FIGS. 9 and 10 refer to the orientation as seen in the drawings, and do not imply any particular orientation when the apparatus is installed in its operating environment.

At the left hand side in FIG. 9, portions of the sub-assembly are broadly identified as corresponding to the motor M, chassis C, suspension R and the actuated object itself, O'. While particular forms of these elements are illustrated in this example, each of them may be substituted for different forms. Some example variations will be described below, while the number of variations available is practically infinite.

In the example illustrated, the object to be moved comprises a body 520 on which the reflective element 22x is formed. As can be seen, each reflective element comprises an elongated, curved, near-planar surface. The actuator 500x has a head 522 on which body 520 is mounted. In this example, the body and actuator provide two rotational degrees of freedom centered on a virtual pivot point 524. A first degree of freedom is rotation about a Y axis pointing into the page in FIG. 10. Displacement in this degree of freedom is indicated by the tilt angle dRy. It will be understood that the tilt angle here is shown highly exaggerated. The second degree of freedom is rotation about an X axis, also through the virtual pivot point 524, the X axis running across the page in FIG. 10.

Actuator 500x may be generally elongated (e.g. cylindrical) in form, allowing it to cluster side by side with similar actuators for the other reflecting elements in the subassembly. An axis 526, vertical in the diagrams, extends in the Z direction. A chassis part of the actuator is formed by cylindrical casing formed in upper and lower sections 528 and 530. Actuator head 522 is fixed to an actuating rod, here shown with an upper portion 532 which tapers in a downward direction to intermediate portion 534 and lower portion 536. In the example, portions 532 and 534 are machined from a single piece of metal, while portion 536 is attached to portion 534 by a screw thread. Such details may be a matter of design choice. The actuator head and rod are supported on upper casing 528 by a combination of bellows section 540 and three tendons, all labeled 542. Each tendon 542 is fixed at a first end 544 into the wall of casing section 528 and at a second end into actuator rod 532, just below the head 522, and run along a respective axis 552. Tendons 542 also pass through apertures 546 and 550 formed in those parts, as shown. For compatibility with the vacuum environment within EUV lithography apparatus, bellows section 540 may for example be made of corrugated metal.

It will be appreciated that the wall thickness and corrugation of the bellows section is thin enough to permit the two dimensional tilting motions dRx and dRy that are desired to adjust the angle of mirror 22x. With regard to other degrees of freedom, tendons 542 effectively form a tripod which constrains the head against translation of desired virtual pivot point 524 in X, Y, and Z directions, while bellows 540 constrains rotation Rz. "Constraining" in this context means providing a very high degree of stiffness against the relevant degree of freedom, sufficient to act effectively as a rigid mounting. The deviation from perfect rigid mounting translates to some parasitic movement when the actuator rod is moved by a motive force to achieve the desired operations of the actuator 500x.

Within upper casing section 528 and surrounding the actuator rod, a flexible link 560 provides a thermal connection between actuator rod part 532 (and via this the mirror body 520) to the casing. Casing section 528 may be mounted in a liquid (e.g., water) cooled base plate, not shown in the drawings. The thermal link may be for example a so-called Litz wire, comprising a bundle of fine copper wires. Instead of a Litz wire, alternative flexible thermal links might be used, like flexible heat pipes. The thermal link introduces further parasitic stiffness, though it may be small in comparison with that of the mounting. The Litz wire may also introduce some hysteresis, which the servo control should take care of.

At the lower end of the actuator rod, rod portion 536 carries a permanent magnet 562, which forms a moving part of a motor function. Bottom section 530 of the casing provides a chamber 564 in which magnet 562 is free to move in both the x and y directions. Thanks to the constraints defining the virtual pivot point 524, displacement dx of magnet 562 translates into the desired tilting motion dRy. Similarly a displacement dy into the page (FIG. 10) is sufficient to effect a tilt dRx about the X axis about the same pivot point 524. To effect this movement in a controllable manner, and specifically to provide actuating forces against the centering force imparted by bellows section 540 and tripod tendons 542, a static portion of the actuator comprises a bipolar electromagnet formed by coils 570 on ferromagnetic core 572. Coils 570 and core 572 are formed in a U shape, and can be energized to provide actuating forces in both positive and negative directions along the X axis to achieve displacement dx and hence rotation (tilt) dRy. The coils though shown as a pair can be energized in unison by connecting them in series. Independent driving of the coils, and different arrangements of coils, are of course possible.

A top view of the core 572 and coils 570 is provided in an inset detail in FIG. 10. As can be seen, a second bipolar electromagnet is formed by a second pair of coils 576 is arranged orthogonally to the coils 570, on a U-shaped core 578. Each electromagnet is provided with pole shoes 580, 582 whose pole faces each fill a quadrant of the circle over which magnet 562 may move. Energizing these coils can be used to impart a displacement dy to the magnet 562, and hence effect a tilt dRx of mirror 22x about the X axis. Drive circuitry MDRVx is provided to generate drive signals MRX, MRY for the coils to achieve desired positioning of magnet 562, in response to command signals CMDx received from a controller CTL.

It will be seen from the above that each actuator 500x comprises a motor of the general type shown as 300 in FIG. 7. Motor parts 562, etc. are labeled consistently with the parts 362, etc. of the motor 300. One difference in this example is that the motor in FIGS. 9 and 10 has separate U-shaped cores 572, 578 for the first and second electromagnets. The example in FIG. 7 has a common ferromagnetic base 374 for both electromagnets. Also, the example in FIG. 7 is illustrated with a larger aperture at the center of the pole faces than may be provided in practice (as compared to the center aperture 588 in FIG. 10).

Controller CTL, for example, may generate command signals for all similar drive circuits in all the actuators of the faceted field mirror or the sub-assembly. Controller CTL can be programmed for example to receive a higher level command CMD, which may indicate a particular desired illumination mode, and to infer the individual positions needed for each field facet mirror. In the example illustrated, a magnetic coupling is used between the actuator rod magnet 562 and the energizing part of the motor formed by coils 570, 576, to allow environmental isolation between different parts of the mechanism. A barrier in the form of non-ferromagnetic membrane 600 provides this isolation in the illustrated embodiment. Membrane 600 is shown in FIG. 10 but omitted in FIG. 9 for clarity. Membrane 600 can extend continuously across several neighboring actuators, simplifying the construction of a multi-actuator array of the type shown in FIG. 9. The membrane may be of thin stainless steel for example. Glass may be used when an optical position sensor of the type shown in FIG. 8 is used. The drive circuitry and electromagnets can thus be placed outside the vacuum environment, or in a sub-environment, distinct from the sensitive environment within the illumination system of an apparatus such as an EUV apparatus. This environmental isolation may relax design constraints and choice of materials on the motor components. It may improve access for maintenance.

The coils 570, when energized, constitute a source of heat, and the choice of magnetic coupling to the actuator rod also provides a useful degree of thermal isolation. The entire actuator assembly should be compact to allow enough individual actuators to be mounted in the available space. The casing inner width (e.g., diameter) may be for example 16 mm and the outer width (e.g., diameter) of magnet 562 may be for example 10 mm, allowing a range of movement dx, dy=+/−3 mm.

As explained above, the detailed implementation of actuators of the type illustrated here may involve a compromise between robustness of the mounting, reflected in stiffness of the bellows section 540 and tripod (tendons 542), and the actuation force available through the motor (here the coils and magnet 562). In PCT patent application publication no. WO 2011/000671 A1, a two-position actuator has a relatively low stiffness in the movement direction, and a much higher stiffness in an orthogonal direction. This resolves the compromise satisfactorily. In the case of the present two-axis, multi-position actuator, however, the resilient mounting should have more or less equal stiffness in both directions. Consequently, the compromise between robustness of the support and ease of displacement becomes much more difficult to achieve, particularly with the limited space and heat dissipation requirements.

In order to reduce the motive force needed, and hence to avoid problems of increased size and heat dissipation in the electromagnets or other motor function, a stiffness compensation technique may be applied in the present example, as will now be explained. As explained more fully in U.S. provisional patent application No. 61/713,930 incorporated herein in its entirety by reference, a magnetic coupling is established between a magnet 602 mounted at the interface between actuator rod sections 532 and 536, and fixed elements 604a and 604b. Elements 604a, 604b are positioned above and below a cavity 606 in which magnet 602 can move with the rod. These parts and the cavity they form are (circularly) symmetric with respect to the axis 526, so that magnet 602 is in the form of a ring, for example with north-pole uppermost and south-pole lowermost. Elements 604a and 604b form upper and lower rings, defining the annular cavity 606.

With progressive displacement dx and/or dy, a greater portion of the magnet 602 will enter the space between the rings 604a and 604b. Its magnetic field lines will increasingly be coupled into the material of the rings 604a and 604b, via casing section 530. This provides an attractive force biasing the magnet 562 radially away from the axis 526, and hence biasing the rod and mirror 22x preferentially into tilted orientations. This magnetic counter-bias partially counteracts centering force provided by bellows section 540. By selection of suitable magnet 602 and by dimensioning the ring portions and cavity 606 appropriately, the relationship between the de-centering bias provided by magnetic coupling and the centering bias caused by the bellows section 540 and tripod (tendons 542), a desired relationship between displacements dx, dy and the energizing strength of the electromagnet coils 570 can be achieved. Without compromising the robustness of the resilient mounting, the actuating force needed to achieve desired positions of the facet mirror 22x can be reduced. In the embodiment illustrated, the lower magnetic coupling ring 604b can be adjusted up and down (z direction) inside casing section 530 by means of screw thread 608. This allows fine adjustment of the magnetic bias characteristic.

Numerous variations and modifications are possible without departing from the spirit and scope of the invention. Some of these have been mentioned already above. Others will be mentioned here, without intending to provide an exhaustive list. While the magnetic coupling in the illustrated examples is a de-centering bias, to counter a centering bias inherent in the resilient mounting of the object to be actuated, other applications and other embodiments may involve a resilient mounting biased in only one direction, with a magnetic counter bias in the opposite direction.

The desire for the particular combination of degrees of freedom and degrees of constraint in actuator 500x is a function of the particular optical system in which it is applied. Other embodiments of such optical systems, not to mention actuators and mountings for totally different applications, may suggest different freedoms and constraints. Even where the desired degrees of freedom and constraints are the same as illustrated here, numerous alternative mechanisms for providing a resilient mounting with the desired freedoms and constraints can be envisaged by the skilled reader. For example, alternative actuator designs disclosed in PCT patent application publication no. WO 2011/000671 rely on leaf springs formed by cutting out material from the casing of the actuator. Such a construction, as well as the bellows construction illustrated in the present application, has a merit of substantially no frictional contact between moving parts, reducing the risk of contaminant particles entering the operating environment.

In principle, the functions of motor magnet 562 and counter-bias magnet 602 could be combined in a single magnet or magnet system. It will be appreciated that lower casing section 530 may act as a shield to prevent interference between neighboring actuators and/or other components. Shielding could additionally or alternatively be provided by an arrangement of plates woven between the actuators (like an egg box). However, cross-talk between neighboring actuators may be greatly reduced by providing each with an individual shield of the type shown. There are thus effectively two shields between any pair of actuators. Moreover, the shield itself has a magnetic influence on the moving magnet 562, so that a symmetrical (cylindrical) shape may help achieve a uniform performance across the 2-D range of movement. In this regard, the casing section 530 acts as part of the magnetic counter-biasing arrangement discussed above. A preferred form of the shield is described further below.

Similarly a shield (not shown) can be provided around the electromagnets formed by coils and cores 570-578, or at least around the pole shoes. Further, thermal management measures can be deployed to remove excess heat from the electromagnets.

Figure 11:
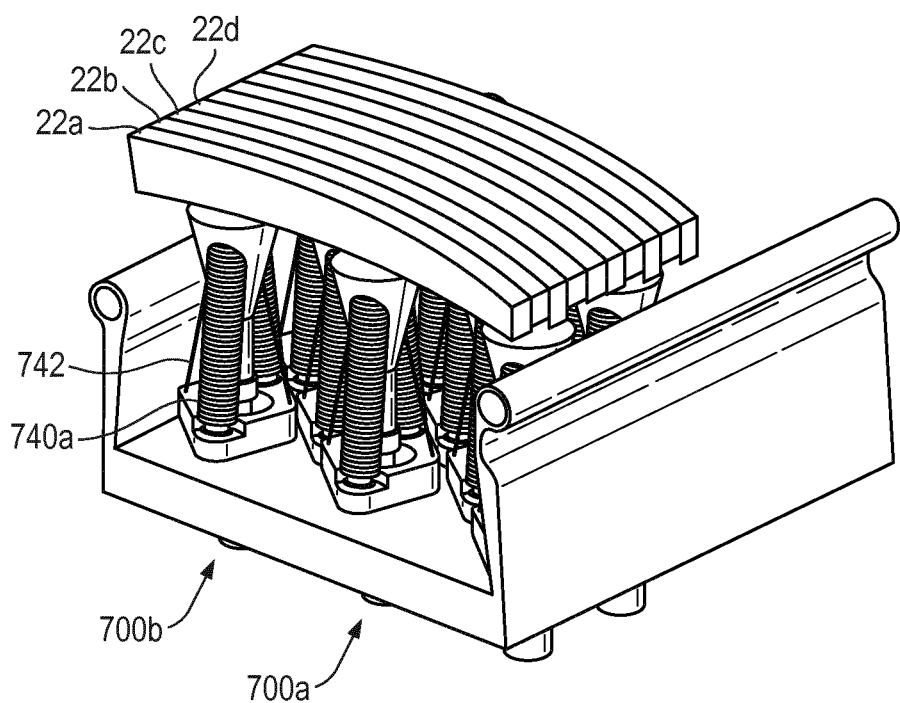
FIG. 11 is an external and partially cut away view of a field facet mirror module in a lithographic apparatus, the field facet mirror module including a number of actuation mechanisms according to an embodiment of the present invention.
Figure 12:
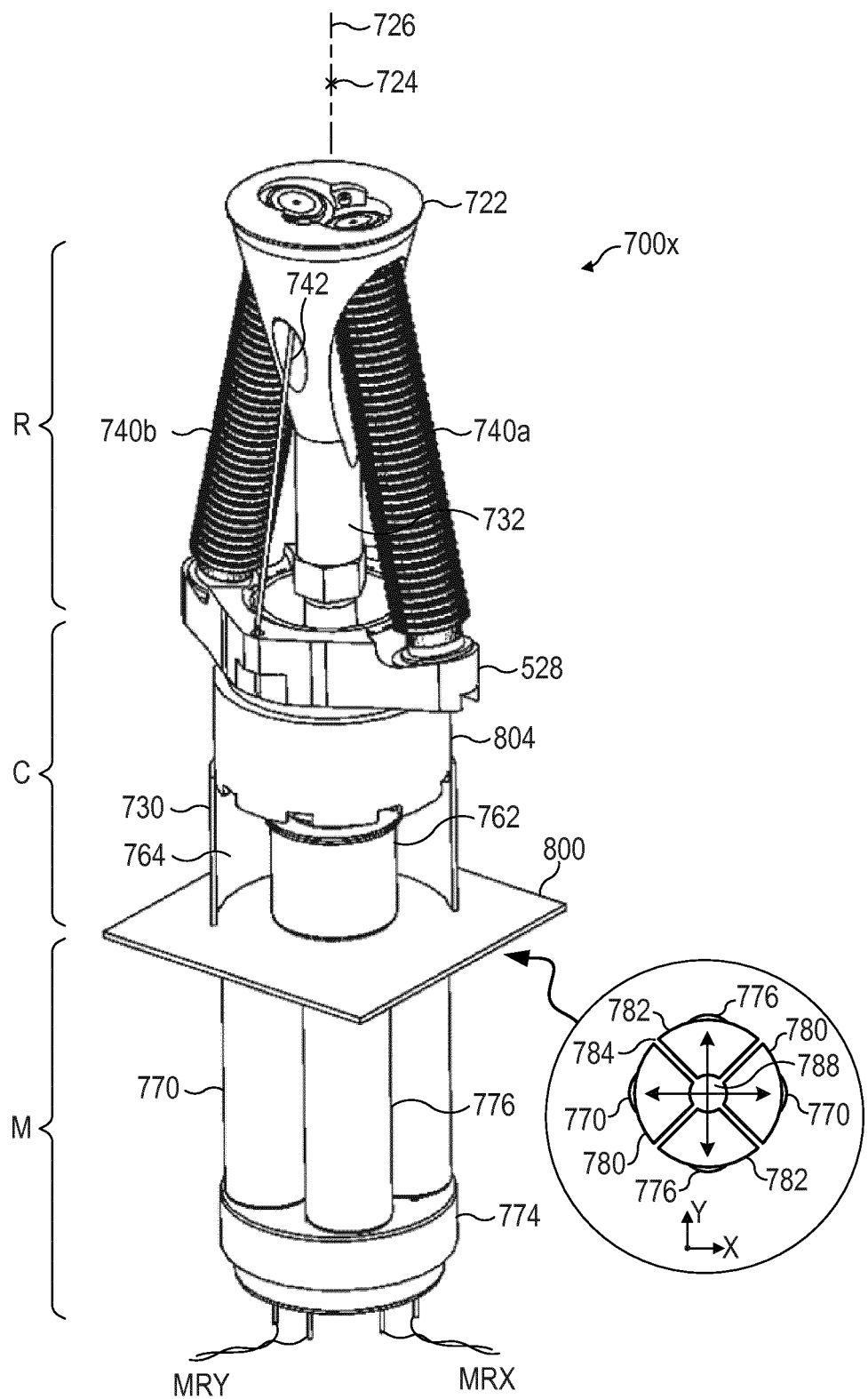
FIG. 12 is a more detailed view of one actuation mechanism in the mirror module of FIG. 11, with a shield part partially cut away.

FIGS. 11 and 12 illustrate an embodiment of the invention in which several actuators including motors of the general type shown in FIG. 7 are applied to effect movement of reflecting elements serving as facet mirrors 22a to 22d etc. in the illumination system of an EUV lithography apparatus such as the ones described above. Many features of this embodiment will be recognizable from their similarity to the embodiment illustrated in FIGS. 9 and 10. Features with reference numbers beginning '7' correspond generally to the features with reference numbers beginning '5' in FIGS. 9 and 10, while features with numbers beginning '8' correspond to those beginning '6' in FIGS. 9 and 10. Differences between the examples concern in particular a difference in the suspension part of the actuator, and some differences in the motor M. Controller CTL and drive circuits MDRVx can be the same as in the previous example.

Concerning the suspension, it will be seen that the single bellows 540 that enclosed the upper part of the mechanism in FIGS. 9 and 10 is replaced by two narrower bellows 740a and 740b extending between the actuator head 722 and two opposite sides of a chassis part 528. Four tendons 742, two of which are in the center of the bellows 740a and 740b, extend from anchoring points on the chassis part 528 to the head 722. As in the case of the three tendons 542 of the previous embodiment, the tendons 742 point towards the virtual pivot point 724, and define the x, y, z position of this point. The bellows 740*a* and 740*b* constrain the Rz degree of freedom. The mirror body 22*x* is omitted, for reasons of space. It will be understood that any component, not only a mirror, may be attached to the head 522 or 722 to be moved by an actuator of this type.

Therefore, where the embodiment of FIGS. 9 and 10 had a suspension arrangement comprising a tripod of tendons and a single bellows in compression, the suspension arrangement in this embodiment comprises a tetrapod of tendons in tension, and two bellows in V-shape that help prevent rotation around the Z axis. The tendons are uniformly spaced around the actuator's central (Z) axis 726. The suspension arrangement again provides two degrees of freedom for tilting the body 722 in direction Rx and Ry. Movement in the Z direction as well as translation in X and Y are substantially or completely prevented. The bellows 740*a*, 740*b* in this embodiment can be filled with Litz wire, or fluid filled so as to serve as thermal conductors instead of or in addition to the Litz wire 560 shown in the previous embodiment. They may also be constructed as heat pipes for greater heat conduction.

A further magnet (802, not shown) may be provided within a cavity in the chassis part 528, to provide magnet counter-bias as described above in relation to magnet 602.

Concerning the motor part of the actuator, this has again the form and function shown in FIG. 7. Moving magnet 762 is attached to the moving shaft 732 of the actuator 700*x*, and its movements are controlled by a first electromagnet comprising coils 770 for displacement in the X direction (rotation Ry) and a second electromagnet comprising coils 776 for displacement the Y direction (rotation Rx). A first difference between this embodiment and that of FIGS. 9 and 10 is that the motor has a single core base 774, similar to the core base 374 shown in FIG. 7, rather than separate cores 572 and 578 shown in FIGS. 9 and 10. This core base 774 is provided with an aperture to allow an optical sensor to measure the tilt of the actuator in at least two dimensions. The sensor, which is omitted from FIGS. 11 and 12 for clarity, can be of the form shown in FIGS. 7 and 8, or any other form. The position sensor can be provided at another place in the mechanism, if space permits.

Another difference from the embodiment of FIGS. 9 and 10 can be seen from the inset detail on FIG. 12, looking down onto the face of pole shoes 780, 782. As mentioned above, each pole face substantially fills a quadrant of an annulus, and that annulus in turn encompasses all desired positions of the moving magnet 762 within chamber 764. The pole shoes are not touching one another, to help ensure that they can be magnetized independently, but the gaps between them are limited to maximize coverage of the annular area. Similarly, the central opening is minimized, permitting just enough space for the optical position sensor to 'see' the moving magnet 762. It can be seen that the central opening 788 is drawn smaller in FIG. 12 than the central opening 588 in FIG. 10. Again, membrane 800 may be of glass or other material transparent to the radiation used by a position sensor. A locking nut 804 may be used to fix the V-shaped suspension assembly to the cooling plate (for example by screwing upwards in FIG. 12). In the examples illustrated, the radius of the central opening 788 is less than 25%, optionally less than 20% or 15% of the radius of the circle. Gaps 784 are used between the adjacent pole shoes so that the pole shoes are not connected pieces of ferromagnetic material. The aim of the design is to fill the circle as completely as possible, and each gap may be less than 10%, optionally 5% of the circle diameter. The gaps may be filled with spacers of non-ferromagnetic material, to help keep the pole shoes apart.

FIGS. 13 to 17 present three-dimensional plots of simulated performance of an example motor of the design shown in FIG. 7, for application in the actuators of FIGS. 11 and 12. The static part of the motor including shielding and casing has a diameter of 16 mm, and a length (from the pole faces) of around 30 mm.

Figure 13:
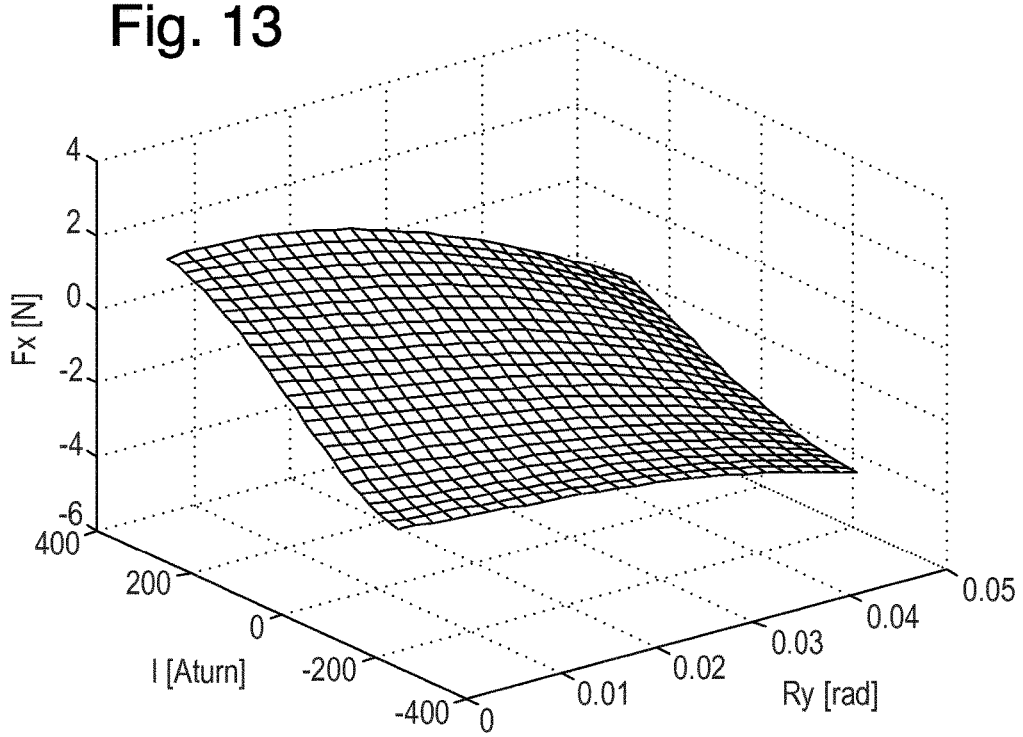
FIGS. 13 to 17 show simulated performance characteristics of the motor included in the actuator of FIG. 12.

In FIG. 13, the driving force Fx in one dimension (x, for example) is shown on a vertical axis, measured in Newtons (N). The force may be negative or positive, depending on its direction. Different values of coil current (ranging from −250 to +250 ampere-turns) are shown by the left horizontal axis. This coil current corresponds to the coil driving signal MRY in FIGS. 7 to 12. The right horizontal axis shows different magnet positions in the driving direction. The right horizontal axis could be marked with linear displacement of the magnet, measured in millimeters, but has been converted for this example to show tilt angle Ry, measured in radians. The position Ry=0 corresponds to the position where the mover is exactly in the center position, and Ry=0.05 rad represents the utmost radial position in one direction. The equivalent displacement x of the magnet 362/762 might be 2.5 mm, for example, depending on the length of the actuator shaft 732. Since rotations are small (plus and minus 50 mrad), translations may be linearly scaled to obtain rotations. The pivot point in this example is located approximately 70 mm away from the radiation reflecting surface of the magnet 762.

The force shown in FIG. 13 includes the influence of the shielding attracting the magnet, but no contribution from any particular suspension or other counter-biasing arrangement. One can notice how the driving force varies for different current levels. From the Figure, it can be seen that the radial force (Fx) is increasingly negative for zero coil current, when moving away from the zero (central) position. As the design is four-way symmetrical about the actuator axis, it will be appreciated that the same performance can be expected over excursions in the negative Ry direction, and also in positive and negative Rx directions. Note that whether a force is positive or negative depends on the co-ordinate conventions used: positive and negative forces are simply forces in opposite directions.

Figure 14:
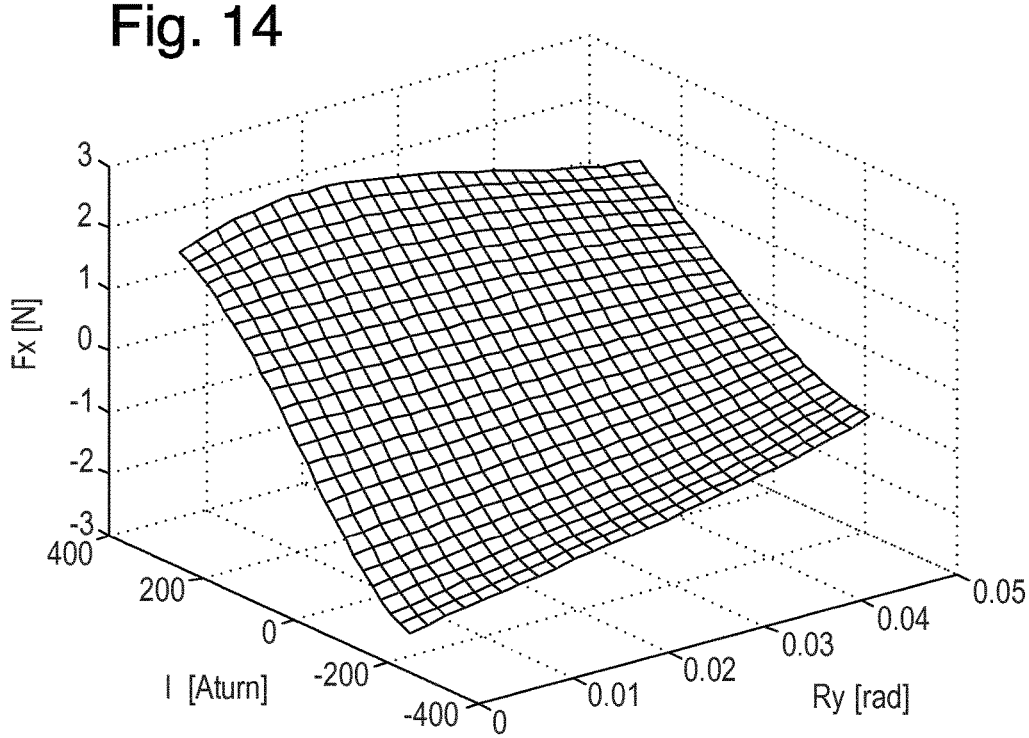

FIG. 14 shows purely the electromagnetic motor force, without the effect of the shielding. The graph demonstrates that the actuator works within the whole working area. However the motor force constant (Fx/I) drops with increased rotation Ry. This can be corrected for in the controller and/or drive circuits. This correction may be applied by a feed-forward correction, or the controller can handle this by increasing the drive current to achieve a desired position based on feedback from the position sensor. The servo control does not need to respond very rapidly, because settling times of the complete mechanism are relatively high, for example in the range 0.1 to 1 second.

Figure 15:
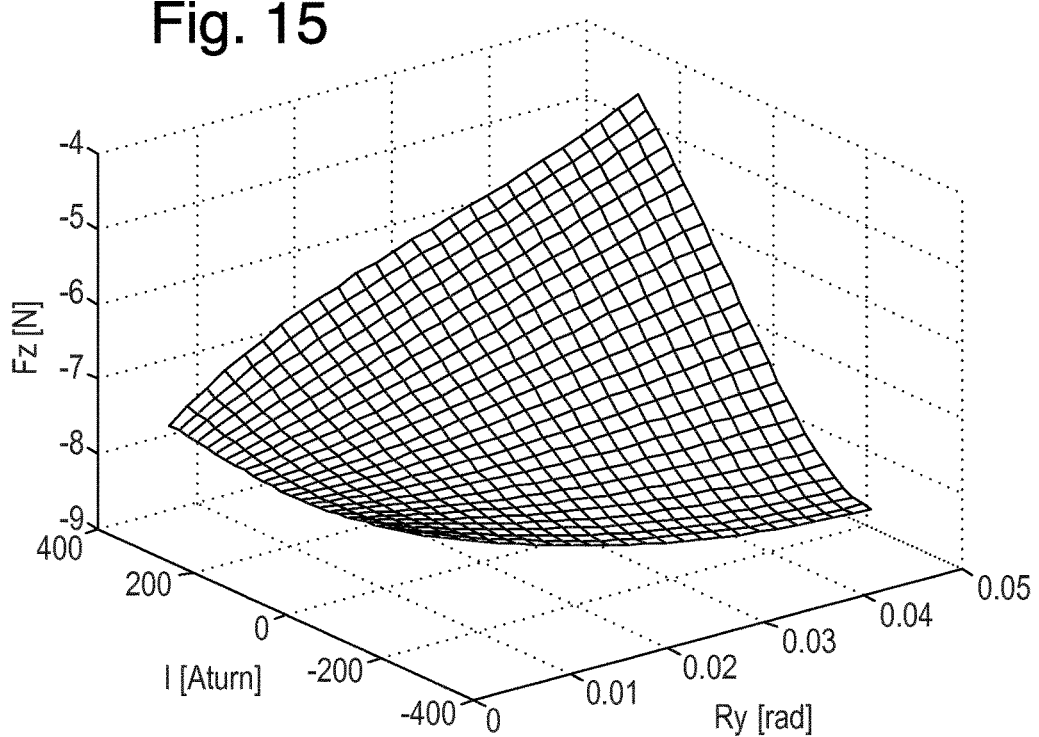

FIG. 15 shows the normal force Fz, pulling the magnet 362/762 toward the pole faces. The suspension, for example the bellows 740*a*, 740*b*, should be designed such to resist this normal force, and so maintain a desired gap 786 between the moving magnet and the pole faces.

Figure 16:
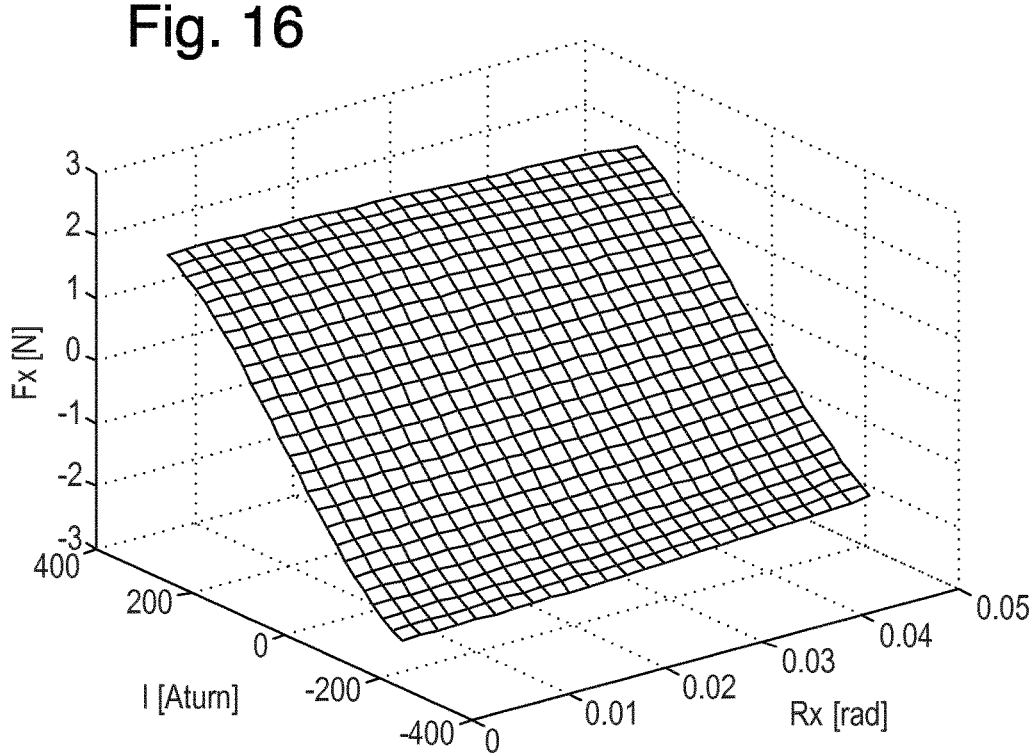
Figure 17:
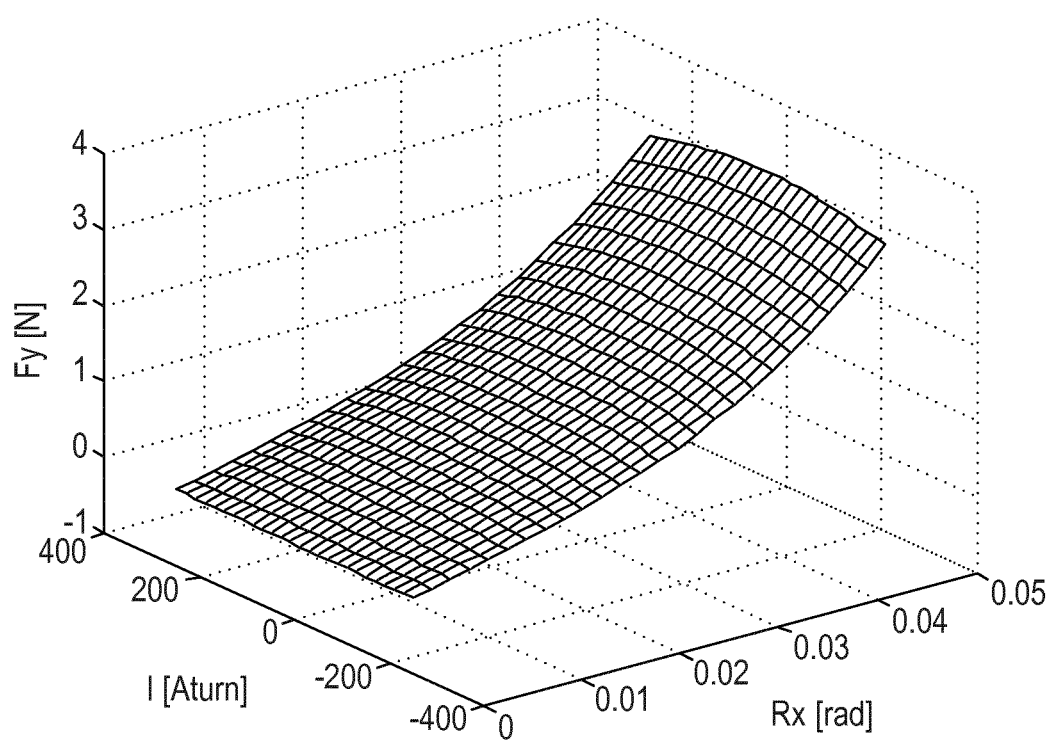

In order to allow independent control of the position in both x (Ry) and y (Rx) directions, the actuator's driving force should be independent of displacements perpendicular to the driving direction. In FIG. 16, the right horizontal axis is Rx, corresponding to a magnet displacement in direction Y, perpendicular to the driving force Fx. It can be seen that the driving force hardly changes at all when moving perpendicular to the force direction. FIG. 17 shows the force perpendicular to the driving direction as function of current and position. This force is substantially independent of the current, confirming that the actuator is purely generating a force in x-direction. Also from FIG. 17 we can see a force varying with the mover position in y (Rx) direction. This is the force due to the attraction of the ferromagnetic shield 730.

The same variations and modifications as discussed for the example of FIGS. 9 and 10 can be applied in the second example of FIGS. 11 and 12. Moreover, features of the different examples can be combined, for example to attach the motor of FIGS. 11 and 12 with the suspension arrangement of FIGS. 9 and 10.

Figure 18:
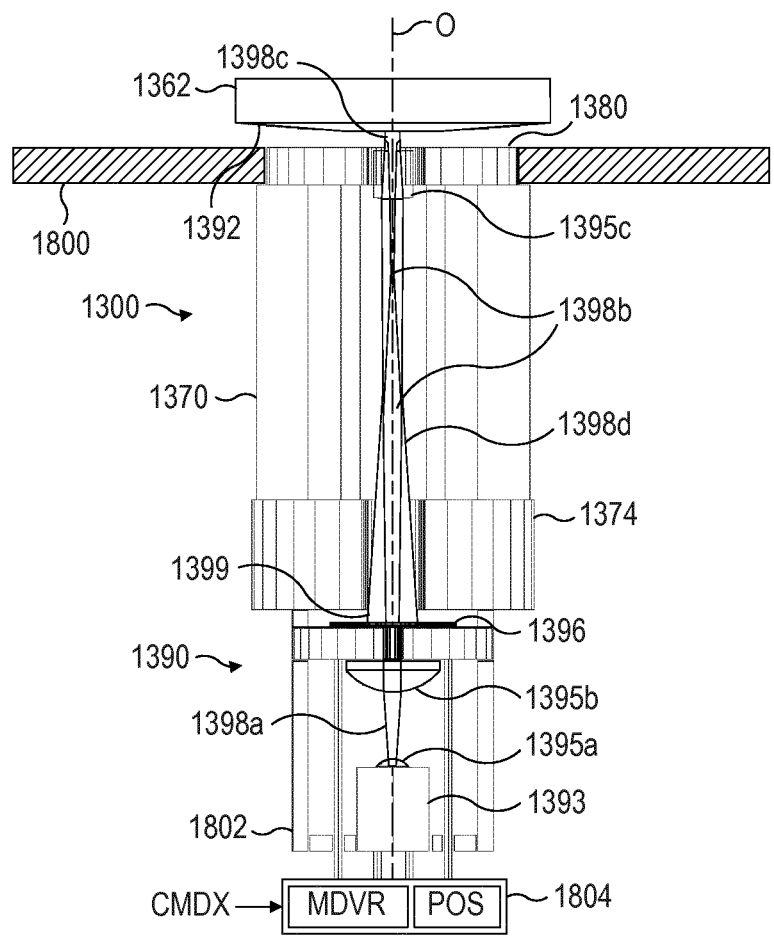
FIG. 18 illustrates the main components of a form of optical position sensor, that may be used in place of the one shown in FIG. 8.

FIGS. 18 to 21 present an embodiment of optical position sensor that may be used in place of the example sensor 390, shown in FIGS. 7 and 8. Referring to FIG. 18, parts corresponding to those shown in FIGS. 7 and 8 are labeled with the prefix '13' in place of '3'. Thus, the static part of the actuator motor is labeled 1300 and includes coils 1370 and core base 1374. The moving magnet of the motor is labeled 1362 and faces the pole shoes 1380. Shown in this illustration is a separating wall 1800, which separates the vacuum environment around the moving part from the non-vacuum environment in which the static part of the motor and the optical position sensor are provided.

As in the example of FIGS. 7 and 8, an optical path is provided through an aperture in the center of the core base 1374 and pole shoes 1380 through which the optical position sensor 1390 can illuminate a reflective surface 1392 on the moving magnet 1362. The components of the optical position sensor 1390 are as follows. Radiation output 1393 comprises for example a vertical cavity surface-emitting laser VCSEL having an exit lens 1395a. As will be seen, in contrast to the arrangement of FIG. 8, the radiation output 1393 in this modified embodiment is located on the optical axis of the sensor, and there is no beam splitter (394). A photodetector 1396 is provided with a central aperture, and surrounds the optical axis. A collimating lens 1395b is mounted between the output and the detector, so as to receive a slightly divergent beam 1398a from the output, and collimate it into a beam 1398b, extending towards the reflective surface 1392 that lies on the face of the moving magnet 1362 facing the pole shoes. The reflective surface 1392 in this example is convex. The reflective surface may be formed by a coating and/or polishing directly on the magnetic material of the moving magnet 1362, or on some layer added to the magnet, for example an encapsulation of the magnet.

In the plane of the wall 1800 and pole shoes 1380, a lens 1395c may be provided, through which beam 1398b passes to reach the reflective surface at 1398c. Lens 1395c may or may not have optical power. Its primary function is to serve as a window permitting the optical beams to pass between the vacuum and non-vacuum environments. After reflection from the surface 1392, radiation re-enters the lens 1395c and forms a beam 1398d, which passes back through the core base 1374 to form an annular radiation pattern at 1399, where it hits the photo detector 1396.

Figure 19A:
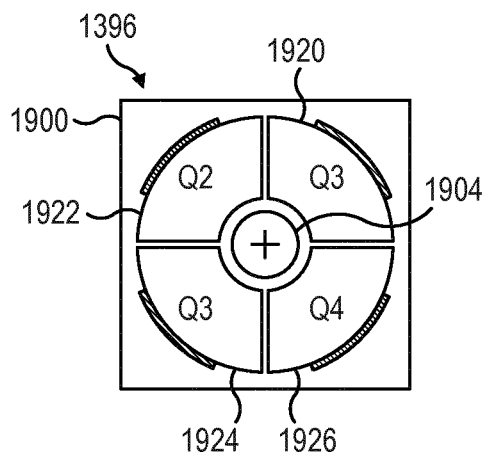
FIG. 19(a) illustrates a plan view of a detector part of the sensor of FIG. 18
Figure 19B:
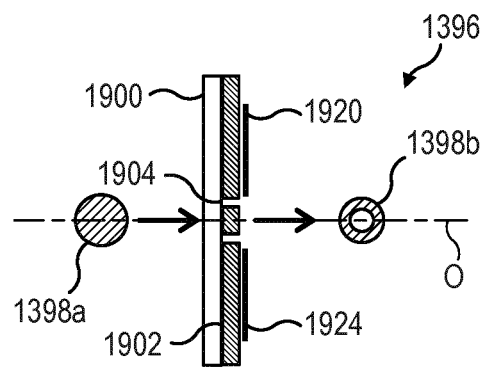
FIG. 19(b) illustrates a cross sectional view of a detector part of the sensor of FIG. 18.

FIG. 19(a) shows the photo detector 1396 in plan view, while FIG. 19(b) shows the detector in a cross section parallel to the optical axis. Various forms of construction can be envisaged, and the following is only one example. Transparent substrate 1900 is provided, for example of glass or plastic. A mask 1902 blocks the radiation from radiation output 1393 except for an annular aperture 1904 that surrounds the optical axis O of the sensor. As shown in FIG. 19(b), circular illumination profile of the beam 1398a emitted by the output 1393 is thereby transformed into an annular illumination profile for the beam 1398b, which travels towards the reflective surface 1392. Instead of being formed on a separate substrate, the mask 1902 can be formed on the surface of an optical component, for example on the back surface of the lens 1395b. Instead of a simple mask having opaque and transparent portions, the annular illumination profile can alternatively be obtained using a diffractive optical element (DOE) as the mask 1902. A DOE can provide the desired profile while using more of the output radiation, whereas a simple mask blocks the most intense, central portion of the beam 1398a. Surrounding this annular aperture on the substrate 1900 is the photosensitive part of the detector module, in this case, a "quad cell" having four photodetector elements 1920 to 1926. The photodetector elements each occupy substantially one quadrant of a circle surrounding the aperture. The quadrants can be labeled for example Q1 to Q4. The optical design of the system comprising elements 1393, 1395a, 1395b, 1395c and 1392 is such that, in operation the ring-shaped aperture 1904, after reflection by surface 1392, is imaged with a certain magnification to form a ring image 1399 onto the "quad cell" formed by the photodetector elements 1920-1926.

Figure 20A:
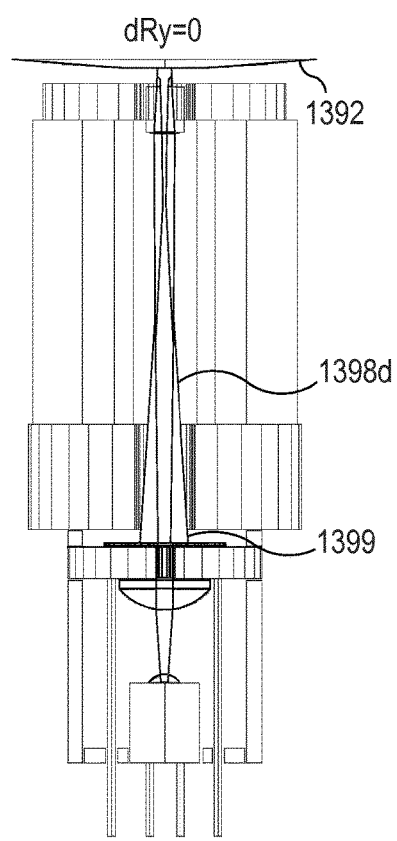
FIG. 20(a) shows a view of the optical position sensor of FIG. 18 with the actuator in a centered position and FIG. 20(b) shows a view of the optical position sensor of FIG. 18 with the actuator in a tilted position.
Figure 20B:
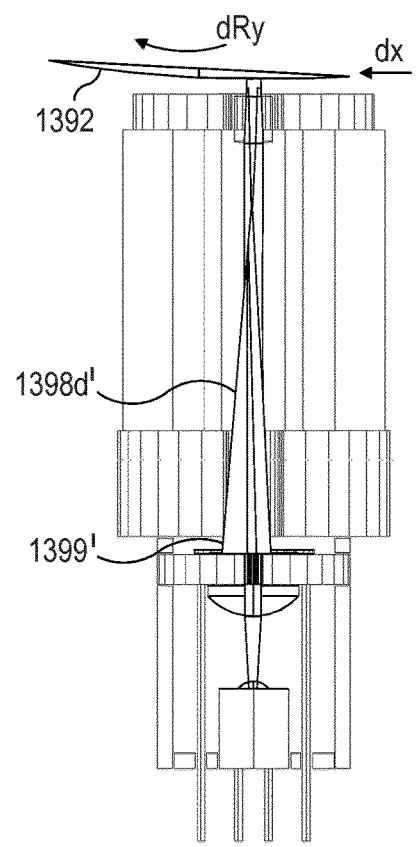

FIG. 20(a) is a copy of FIG. 18, and shows the path of the annular beam 1398b, when the reflecting surface 1392 is in its untilted position, indicating that the moving magnet 1362 of the actuator is centered. FIG. 20(b), on the other hand, shows the situation in which the reflective surface 1392 is tilted, indicating that the actuator has moved to an off-center position with a certain angle dRy or displacement dx. Due to the curvature of the reflective surface, the angle of deflection of the beam is less than two times the angular deflection dRy. As a consequence of the deflection, the ring of radiation 1399 moves from its centered position to an off-centered position 1399'—shown in FIG. 20(b). It will be appreciated that in fact the drawing shows a situation in which we have rotation in two directions: dRx and dRy are both non-zero.

Figure 21A:
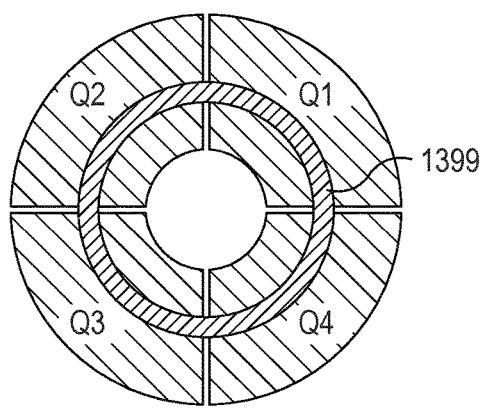
FIG. 21(a) shows the position of an annular radiation pattern on the detector of the optical position sensor, with the actuator in the centered position shown in FIG. 20(a)
Figure 21B:
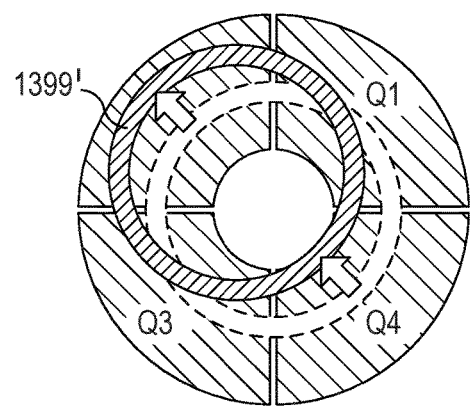
FIG. 21(b) shows the position of an annular radiation pattern on the detector of the optical position sensor, with the actuator in the tilted position shown in FIG. 20(b)

FIG. 21(a) shows schematically the position of the ring image 1399 in the centered position on the photo sensitive elements, and FIG. 21(b) shows schematically the position of the ring image 1399 in the off-centered position. In one example, the actuator core base 1374 has a central aperture of 4 mm diameter and a length of 30 mm. The tilt-range is from −3 to +3 degrees, while the range of movement of the ring image is reduced by applying curvature of radius 105 mm or so to the reflective surface 1392. This radius of 105 mm is still larger than the distance of the pivot point of the convex mirror to the mirror surface of this mirror (this distance is about 70 mm), but significantly smaller than the infinite radius of a flat mirror. Note that for a mirror radius equal to the distance pivot point–mirror surface (in the example case 70 mm), the ring image will not move at all when the mirror is rotated. Thus the choice for the radius of curvature determines the trade-off between measurement range and resolution. A high resolution of position measurement, for example 1 in 2500, is achieved in this practical example by the choice of the radius of curvature mentioned above and using photovoltaic detectors as the photosensitive elements 1920-1926. Each element then produces a current that is linearly related to the radiation energy falling on its area. Such quad cells are known generally, though without the central aperture and ring-shaped illumination. Alternative types of photosensitive elements may be used, such as the position-sensitive device (PSD) or pixel array sensor mentioned for use in the example of FIG. 8. However, photovoltaic cells have very good noise characteristics and speed of response.

By simple arithmetic combinations of signals from the four elements 1920-1926, position X, Y signals can be calculated. If the photocurrents from the four quadrant sensors are represented by signals Q1 to Q4, signals representing X and Y displacement can be simply derived as ratios:

$$X=((Q1+Q4)-(Q2+Q3)/(Q1+Q2+Q3+Q4)$$

$$Y=((Q1+Q2)-(Q3+Q4)/(Q1+Q2+Q3+Q4)$$

When the ring image 1399 is centered as shown in FIG. 21(*a*), all quadrants receive equal radiation and the values for X and Y are zero. When the ring image 1399' moves off-center, as shown in FIG. 21(*b*), the X and/or Y values will increase in a positive or negative way, according to the direction and magnitude of displacement. Note that this ratio form of calculation automatically removes any variation in the overall intensity of the illumination source, detector sensitivity and the like. It will be appreciated that the raw X, Y signals derived from the quad cell signals may not relate linearly to angular displacement dRx, dRy. Signal processing can be applied, and a calibration relationship can be stored to convert angular position of the mirror to the raw X, Y values calculated by the above formulae. Alternatively or in addition, the desired raw X, Y values for each desired positions of the mirror can be directly memorized, so that a linearizing calibration is not necessary. These different types of calibration can be implemented by design, or can be obtained during a set-up process when the illumination system is assembled. Signal processing can be performed in the analog domain, the digital domain or a mixture of both.

The size of the ring image 1399 at the detector can be tuned by changing the powers of the lenses 1395*a*, 1395*b* and/or 1395*c*. Aims of the design are to maximize the range of travel of the ring image without allowing the reflected radiation to impinge on the surrounding components of the motor, or re-enter the aperture at the center of the detector 1396. Allowing even a small portion of radiation to be reflected back into the laser-type source 1393 can disrupt its operation. The dark portion at the center of the annular illumination profile allows this to be avoided while permitting the co-axial arrangement of source and detector. Lens 1395*a* may be a part of a commercially-available VCSEL module, whereas the lenses 1395*b*, 1395*c* can be tailored to the specific requirements of the tilt sensing application. Lens 1395*b* can however be integrated into a module with a VCSEL, relaxing the tolerances for assembly of the overall system. FIG. 21(*b*) thus shows the maximum excursion. By using a convex reflective surface 1392, the range of excursion of the ring image 1399 can be tuned by changing the convex radius of curvature.

In other variants, reflective surface may be formed by the back of the field facet mirror itself, or a mirror which is mechanically fixed to the field facet mirror. The tilt sensor of FIGS. 18-21 can be applied in other applications, besides a faceted mirror. In the illustrated embodiment, the actuator motor 1300 and the sensor 1390 are located on top of one another, within a shared housing 1802, so that the complete control-loop (position calculation module POS and motor drive circuitry MDRV similar to that shown in FIG. 7) can be implemented locally within a self-contained module 1804 within or attached to the same housing. That is to say, only the position command CMDx for facet x needs be delivered to the actuator module, which then includes within it all components necessary to implement the position calculation, motor drive circuits and feedback control. This greatly reduces the number of electrical connections into the illuminator, particularly when one considers an embodiment with tens or hundreds of facet mirrors and actuators.

The modified sensor 1390 may have a number of advantageous features. For high-resolution it can be arranged that the radiation, which reflects from the tilted reflecting surface 1392, does not hit the actuator walls and does not miss the detector. The optical tilt sensor may be mounted coaxially with the actuator, so that it can be made compact and cheap with simple optical components. Moreover, by avoiding that reflected radiation can re-enter the radiation output, a laser such as a VCSEL can be used, rather than for example a conventional LED source. Other types of radiation source can be used, but VCSELs are attractive for this application in that they naturally provide a collimated, radially symmetric beam, operate at very low power and are very durable. The lenses for example can be made of PMMA. In one example having the dimensions given above, the optical part of the position detector 1390 can be made less than 20 mm long, which is much shorter than in the FIG. 8 embodiment. This frees up space for example to make the whole assembly shorter, or to include signal processing and drive electronics.

The sensor can be applied to measure tilt of any moving part in a wide range of applications. The sensor directly measures tilting of the reflecting surface, which may be associated with tilting (angular) motion of the moving part, or with translational motion. The sensor having a curved reflective surface is sensitive to both tilt and translation of the body which carries the reflective surface. In the case of the moving magnet 1362, for example, the angle at which the beam is reflected will be influenced by decentering of the optical axis of the convex mirror 1392, as well as by the angular displacement which is intended to be measured. Since the sensor in combination with the curved reflecting surface cannot distinguish between the effects of tilt and the effects of translation, the intended use of the sensor is applications with only tilt, with only translation or with a fixed proportionality between tilt and translation. In the above described embodiment the displacement is strictly proportional to the tilt (due to the pivot point around which the target mirror 1392 is rotated) and the combination of both effects results in the correct determination of the tilt angle. Due to the fixed proportionality, instead of the tilt of mirror 1392, also its off-axis translation could have been calibrated. It happens that in the example application of an actuator for a field facet mirror 22*x*, it is the tilt that is of most interest.

Components of the actuator should be specified according to the application and environment in which it will operate. For the environment inside an EUV apparatus, considerations include vacuum compatibility (with substantially no outgassing), and tolerance of a low pressure gas, such as hydrogen atmosphere (partial pressure for example 2 to 20 Pa). This may influence the choice of magnet material. For example, SmCo may be used for the moving magnet material. Other materials, such as FeNdB, may suffer $H_2$ embrittlement unless encapsulated. Encapsulation will increase the gap 586, 786 undesirably, and introduces the risk of leakage.

In accordance with embodiments of the invention, the novel motor can be designed successfully to generate planar driving forces in a controlled system with feedback. The concepts presented herein may allow a system designer to: provide a controllable driving force in two degrees of freedom; restrict the stray fields when several actuators are mounted side-by-side; reduce the driving force as an additional advantage of magnetic shielding; work within very limited volume, for example to a width of 10-20 mm, e.g. 16 mm and height of 20-40 mm, e.g. 30 mm; limit power dissipation, for example to less than 5 W or less than 3 W per actuator; and/or limit the power consumption.

Figure 22A:
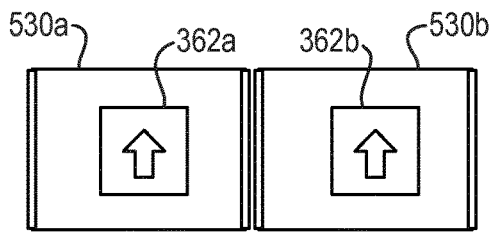
FIGS. 22(a) and 22(b) show movers of two adjacent actuators of a reference example in different positions.
Figure 22B:
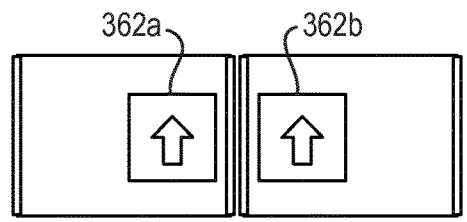
Figure 23A:
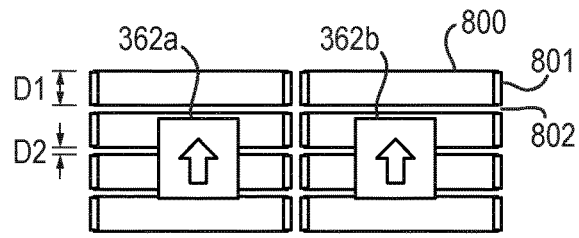
FIGS. 23(a) and 23(b) show the movers of two adjacent actuators according to an embodiment of the invention in different positions.
Figure 23B:
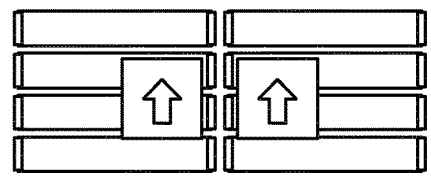

The modifications described in FIGS. 18 to 21 and in FIGS. 22 and 23 can each be used together in one apparatus with any of the actuator designs shown in FIGS. 7 to 17. The optical sensor of FIGS. 18 to 21 can be used in many applications independently of the particular actuators.

As mentioned above, shield 530 or shield 730 is provided to reduce the effect of stray fields on and from the magnet 362. Such stray fields can arise from many different sources. For example, the presence of nearby magnetic or ferromagnetic material can give rise to stray fields either through residual magnetization of the magnetic or ferromagnetic material or through distortion of the fields generated by coils 370. If the magnetic or ferromagnetic material is part of a movable component of a complex apparatus, such as a lithographic apparatus, the stray fields may change with time and may not be readily predictable. In an arrangement where a plurality of actuators are arranged closely together, such as that described above, stray fields may arise from the adjacent actuators and may vary as the magnets of the actuators move and as different actuation fields are applied by coils 370. In such a case stray fields can be regarded as a form of cross-talk. To some extent the effects of stray fields can be addressed through appropriate control systems, e.g. feedforward controls, where the effects of the stray fields are known or predictable, and feedback control in other cases. However, construction of suitable feedforward control systems is difficult and complex. Where feedback control is used, the responsiveness of the actuator can be reduced due to increase settling times.

Figure 25:
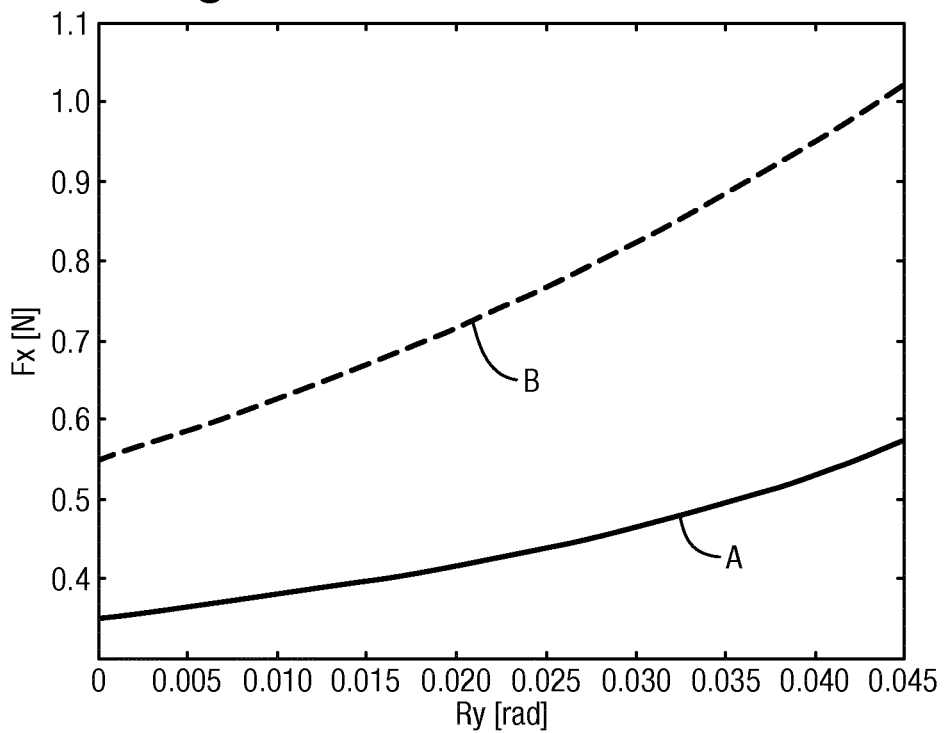
FIG. 25 shows the position dependency of forces exerted on an unshielded mover for two different positions of the mover of an adjacent actuator.

The effect of cross-talk between actuators can be seen by considering the simplified case of two adjacent actuators of the type described above but without any magnetic shielding around the mover (magnet). In FIG. 25, the force in the X direction (Fx[N]) on the magnet of a first actuator is given as a function of the position of the magnet, as represented by the equivalent rotation of the attached driven member (Ry [rad]). In FIG. 25 the solid line (A) indicates the force in the case where the magnet of the second actuator is in a central position whilst dotted line (B) indicates the force in the case where the magnet of the second actuator is displaced towards the first actuator. The substantial difference between the two curves indicates the large cross-talk effect. In both cases, the force on the magnet of the first actuator tends to return the magnet to its central position.

Figure 26:
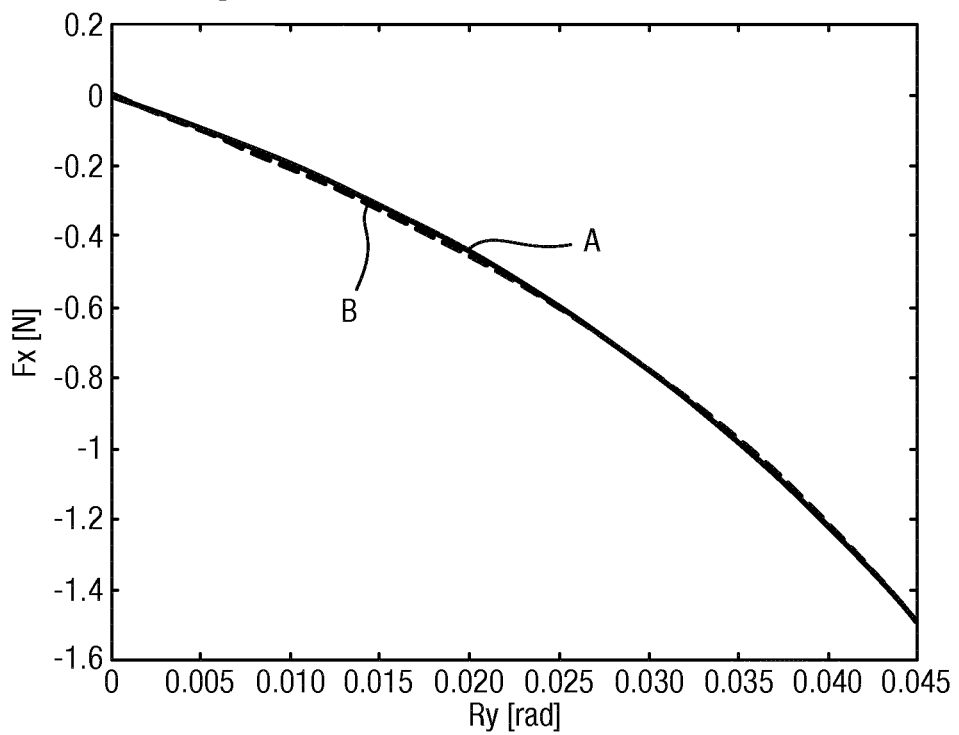
FIG. 26 shows the position dependency of forces exerted on the mover of an actuator of the reference example of FIGS. 22(a) and 22(b) for two different positions of the mover of an adjacent actuator.

The effect of adding a simple cylindrical shield of ferromagnetic material, e.g. iron to the first and second actuators is illustrated in FIG. 26. Such an arrangement is shown in FIGS. 22(*a*) and 22(*b*). In FIG. 22(*a*) the two magnets 362*a*, 362*b* of the first and second actuators are in central positions whilst in FIG. 22(*b*), the two magnets are adjacent the shields in the direction of the adjacent actuator. In other words, the two magnets are closest to each other. As shown in FIG. 26, which shows the same variables as FIG. 25, in both cases (A—magnets centered, B—magnets close together) the same force is experienced by the magnet of the first actuator as a function of its position. Thus the shield is effective to eliminate the cross-talk effect. However, the force on the magnet is now negative, indicating a force away from the central position, i.e. towards the shield. This force may be referred to as a decentering force. Such a force creates a negative effective stiffness of the actuator and requires a continuous centering force to be exerted, increasing the power consumption of the actuator. There is also a risk that if insufficient centering force is exerted, the magnet can suddenly snap to the shield possibly causing damage to the actuator and the attached member. Moreover, the attraction force after a snap could be so high that the actuator may not be capable of compensating it anymore.

An embodiment of the invention comprises an actuator, such as one of those described above with an improved shield against stray fields and/or cross-talk. Save in relation to the shield, an embodiment of the invention can be the same as any of the above described actuators. An example of an improved shield usable in an embodiment of the invention is depicted in FIGS. 23(*a*) and 23(*b*). Overall, the shield 800 has the form of a cylinder of the same dimensions of the shield of the reference example of FIGS. 22(*a*) and 22(*b*). Shield 800 is constructed from a plurality of rings 801 separated by interruptions 802. In this embodiment there are four rings 801. Rings 801 are formed of a ferromagnetic material, e.g. iron. Interruptions 802 can take the form of rings of non-magnetic material such as copper, aluminum or plastics. Interruptions 802 can take the form of empty gaps which will be filled with the ambient atmosphere of the actuator or a vacuum. In an embodiment, the shield has a mixture of interruptions formed by gaps and interruptions formed by non-magnetic material. Rings 801 have a width D1 in an axial direction, i.e. perpendicular to the direction of movement of magnet 362. Interruptions 802 have a width D2 in the axial direction.

FIG. 27 shows the same variables as FIGS. 25 and 26, that is the force Fx exerted on the magnet 362*a* of the first actuator having a shield 800 with D1=3 mm and D2=1 mm as a function of its position, represented by the rotation Ry of the attached member. Again, forces for two cases are shown: A—where magnet 362*b* of the second actuator is at the central position (FIG. 23(*a*)) and B—where the magnet 362(*b*) of the second actuator is adjacent the shield closest to the first actuator (FIG. 23(*b*)). It will be seen that the force on the magnet is still negative, i.e. away from the center, but it is significantly reduced in magnitude, e.g. about −1.1 N at maximum compared to about −1.5 N at maximum for the continuous shield example. There is a small difference in the force experienced by the magnet 362*a* in the two different cases of the position of the magnet of the second actuator, i.e. a small amount of cross-talk is now experienced. However, the amount of cross-talk is very much less than the reduction in the de-centering force so overall there is a significant improvement through the provision of the interruptions 802 in the shielding 800.

Figure 24A:
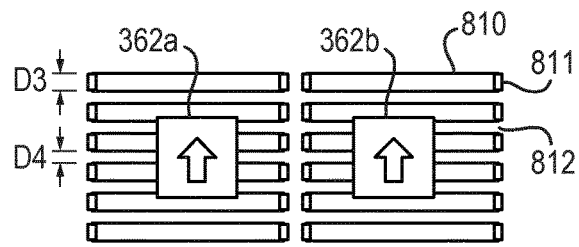
FIGS. 24(a) and 24(b) show movers of two actuators according to another embodiment of the invention in different positions.
Figure 24B:
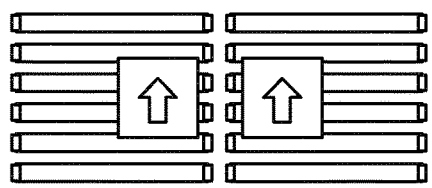

FIGS. 24(*a*) and 24(*b*) illustrate schematically a shield 810 having interruptions according to another embodiment of the present invention. The configuration of shield 810 is similar to that of shield 800 save that there are more rings 811, each having a smaller axial thickness D3, and consequently more gaps 812, each having axial thickness D4.

FIG. 28 depicts the same variables as FIGS. 25 to 27 for an actuator having a shield with D3=1 mm and D4=1 mm. As with the case of shield 800, a mover surrounded by the shield 810 experiences a negative (de-centering) force but this is further reduced compared to the actuator using shield 800. At maximum, the de-centering force with shield 810 has a magnitude of about −0.85 N compared to −1.1 N in the case of shield 800 and −1.5 in the case of the continuous shield. The actuator using shield 810 does exhibit a greater amount of cross-talk, i.e. different forces are experienced in a case where the second actuator is adjacent the shield in the direction towards the first actuator, indicating that some field is leaking through. Nevertheless the reduction in decentering force outweighs the increase in cross-talk.

Figure 29:
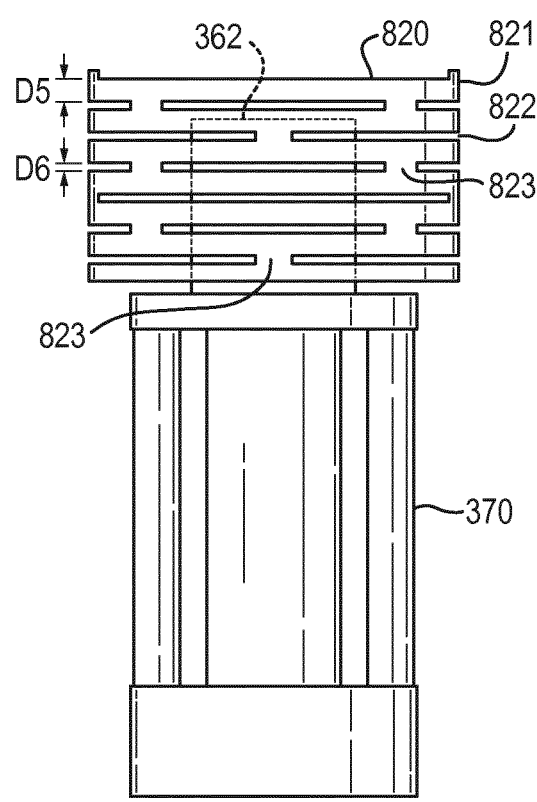
FIG. 29 depicts a shield according to another embodiment of the invention.

FIG. 29 depicts a shield 820 according to a further embodiment of the invention surrounding magnet 362 and mounted above coils 370. In shield 820, rings 821 of ferromagnetic material are joined by small bridges 823 due to the fact that interruptions 822 do not extend around the entire circumference of shield 820. The axial thickness D5 of rings 821 and the axial thickness D6 of interruptions 822 can be the same as described above. Provided that the bridges 823 are small their presence does not have a noticeable effect on the shielding performance and the forces experienced by magnet 362. In an embodiment, bridges 823 have a width in the circumferential direction of the shield less than about 5% of the circumference of shield 820 and desirably less than 2%. In an embodiment, the bridges are distributed around the circumference of the shield so that not all bridges are aligned.

In an embodiment of the invention, the dimensions of the shield and the interruptions in it can be determined by a skilled person to achieve a desired performance that balances decentering force with insensitivity to cross-talk and/or stray fields. In an embodiment, the shield also functions to prevent magnet fields generated by the actuator itself extending outside the actuator. The actuator of the invention is useful in applications where it is to be placed near other field-sensitive components or devices. In an embodiment, the ratio of the width of the ferromagnetic shielding parts to the width of the interruptions is about 0.5 to 5, desirably about 1 to 3. The width of the ferromagnetic parts and the interruptions is measured in the same direction. That direction is either the direction of the expected stray fields or perpendicular to a range of movement of the mover of the actuator. In an embodiment at least some ferromagnetic shielding parts and/or some interruptions have different widths than other ferromagnetic shielding parts and/or interruptions. In an embodiment all the ferromagnetic shielding parts have the same width. In an embodiment all the interruptions have the same width.

In an embodiment of the invention there are between 2 and 10 interruptions along a line parallel to an axis of the shield. However, the number of interruptions chosen for the shielding may depend on the type of application and the length of parts to be shielded. For example, there can be more than 10 interruptions, or even more than 100 interruptions along a line parallel to an axis of the shield.

In an embodiment, the interruptions are elongate. In an embodiment the long dimension of the interruptions is at an angle of greater than 30 degrees, desirably greater than 45 degrees, more desirably greater than 60 degrees, more desirably greater than 75 degrees to the field direction of the expected stray fields, the fields generated by the actuator or the axis of the shield. In an embodiment, the long dimension of the interruptions is at an angle of less than 30 degrees, desirably less than 15 degrees to a plane of movement of the mover.

In an embodiment, the mover contains a permanent magnet or an electromagnet such as a coil.

In an embodiment of the invention, the thickness of the shield is in the range of from 0.5 mm to 2.0 mm, desirably in the range from 0.8 mm to 1.0 mm. The thickness can be determined in a specific application according to the magnetic fields expected and the material chosen. It is desirable that the shield material does not saturate in the expected magnetic fields. In an embodiment, two or more shields are arranged concentrically around the mover.

In an embodiment of the invention, the cross-section of the shield perpendicular to the axis thereof is circular. Desirably, the shield is rotationally symmetric about the center of the range of movement of the mover. A circular cross-section may be advantageous when the actuator is rotational symmetric, however in other applications different cross sectional shapes will do and might be beneficial as well. A circular cross-section is furthermore advantageous because the decentering force is then dependent substantially only on distance of the mover from the center, i.e. the decentering force is direction independent, and therefore a control system of the actuator to counteract the decentering force can be easily constructed. In embodiment of the invention, the cross-section of the shield perpendicular to the axis thereof has a shape that tessellates in a plane, e.g. triangular, square or hexagonal. A shape that tessellates is advantageous in allowing actuators to be positioned closely in an array.

In an embodiment of the invention, the cross-section of the shield perpendicular to the axis thereof is constant, i.e. the shield is prismatic. A shield with constant cross-section can be manufactured easily. In an embodiment, the shield is cylindrical. A cylindrical shield combines the advantages of easy manufacture and direction independent decentering force. Shields with complex shapes can be assembled from multiple parts or manufactured using additive manufacturing techniques.

In an embodiment, a plurality of actuators are placed close together, e.g. in a regular array. In an embodiment, all actuators in an array are provided with shields according to the invention. An advantage of all actuators having shields is that it simplifies the provision of control systems; the control systems for each actuator can be similar. In an embodiment of the invention actuators provided with shields according to the inventions are arranged in an array with actuators not having shields so that no two actuators without shields are adjacent. In such an arrangement, actuators without shields are surrounded by actuators with shields so that there is always one layer of shielding between any two actuators. Reducing the number of shields that are provided can reduce costs and enable actuators to be placed closer together. In an embodiment having multiple shielded actuators in an array, the interruptions can be arranged so they are not aligned. In an embodiment, the pitch between actuators in an array is in the range of from 10 mm to 30 mm. In an embodiment, the gap between actuators in an array is in the range of from 1 mm to 3 mm.

In an embodiment, the ferromagnetic material is selected from the group consisting of: Fe, FeCo, SiFe, ferromagnetic steel, Ni, and alloys thereof. In an embodiment, the interruption is formed of a material selected from the group consisting of: Al, Cu, non-magnetic steel and alloys thereof or plastics. Plastics are preferred when not applied in vacuum surroundings. A shield having interruptions formed of a non-magnetic solid material can have superior physical properties, such as structural strength and heat conduction. The non-magnetic material can assist in maintaining the spacing between the ferromagnetic shielding parts. In an embodiment, the interruption is a gap. To form the interruptions as gaps, conventional manufacturing processes such as drilling, sawing and milling can be used.

In an embodiment, the material(s) from which the shield is constructed is (are) selected to minimize outgassing in a vacuum or to resist corrosion from an atmosphere that is expected in use of the actuator. In an embodiment, the shield is provided with a surface treatment or coating selected to minimize outgassing in a vacuum or to resist corrosion from an atmosphere that is expected in use of the actuator.

Although specific reference may have been made above to the use of embodiments of the invention in the context of EUV optical systems, it will be appreciated that the invention may be used in other applications, whether in optical systems, whether in lithography or completely different applications, and whether in vacuum or other environments. For example, an actuator according to an embodiment of the invention can be used in optical systems for positioning optical elements where particular accuracy is required or for positioning parts near the mask support or substrate support where there are large moving masses that can generate unpredictable stray fields.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

What is claimed is:

1. An actuation mechanism comprising:
    a moving part and a static part, the moving part including a magnet that is driven to move across a working range by magnetic fields generated by the static part; and
    a shield comprising first and second portions and an interruption between the first and second portions, wherein the shield surrounds the working range of the magnet to reduce propagation of magnetic fields and is formed of a ferromagnetic material.

2. The actuation mechanism according to claim 1, wherein the interruption is a gap.

3. The actuation mechanism according to claim 1, wherein the interruption is a member formed of a non-magnetic material.

4. The actuation mechanism according to claim 1, wherein the interruption extends from an interior of the shield to an exterior of the shield.

5. The actuation mechanism according to claim 1, wherein the interruption is elongated in a direction that is substantially perpendicular to a field direction of a magnetic field external to the actuation mechanism.

6. The actuation mechanism according to claim 1, wherein the interruption is elongated in a direction that is substantially coplanar with a direction of movement of the magnet.

7. The actuation mechanism according to claim 5, wherein the interruption has a width in the range of 0.5 mm to 2 mm.

8. The actuation mechanism according to claim 1, wherein the interruption divides the shield into at least two non-contiguous bodies of ferromagnetic material.

9. The actuation mechanism according to claim 1, wherein the interruption divides the shield into at least two bodies of ferromagnetic material joined by one or more small bridges.

10. The actuation mechanism according to claim 1, wherein the first and second portions are substantially annular.

11. The actuation mechanism according to claim 1, wherein the first and second portions have a width in the range of 0.5 mm to 4 mm.

12. The actuation mechanism according to claim 1, wherein the magnet is a permanent magnet.

13. The actuation mechanism according claim 1, arranged to provide movement with at least two degrees of freedom, wherein the magnet has a magnetic face constrained to move over a working area lying substantially in a first plane perpendicular to a direction of magnetization of the magnet, and the static part comprises at least two electromagnets having pole faces lying substantially in a second plane closely parallel to the first plane, the pole faces being symmetrically distributed around a central position in the second plane and extending over substantially the whole area traversed by the face of the moving magnet.

14. The actuation mechanism according to claim 1, wherein the first and second portions are rings.

15. An actuation system comprising:
    a plurality of actuation mechanisms, each comprising:
        a moving part and a static part, the moving part including a magnet that is driven to move across a working range by magnetic fields generated by the static part; and
        a shield comprising first and second portions and an interruption between the first and second portions, wherein the shield surrounds the working range of the magnet to reduce propagation of magnetic fields and is formed of a ferromagnetic material.

16. The actuation system according to claim 15, wherein the plurality of actuation mechanisms are set out in a closely packed array; with the shields of adjacent actuators touching or in close proximity.

17. An actuation system comprising:
    a plurality of first actuation mechanisms, each of the first actuation mechanisms comprising,
        a moving part and a static part, the moving part including a magnet that is driven to move across a working range by magnetic fields generated by the static part; and
        a shield comprising first and second portions with an interruption between the first and second portions, wherein the shield surrounds the working range of the magnet to reduce propagation of magnetic fields and is formed of a ferromagnetic material, and
    a plurality of second actuation mechanisms, the second actuation mechanisms not having a ferromagnetic shield, wherein the first actuation mechanisms and the second actuation mechanisms are arranged so that no two second actuation mechanisms are directly adjacent.

18. An optical apparatus comprising:
a series of optical components arranged to receive a radiation beam from a radiation source to process and deliver the beam to a target location, wherein the optical components include one or more movable optical components mounted on an actuator mechanism comprising,
  a moving part and a static part, the moving part including a magnet that is driven to move across a working range by magnetic fields generated by the static part; and
  a shield surrounding the working range of the magnet to reduce propagation of magnetic fields, the shield being formed of a ferromagnetic material and having therein at least one interruption; and
a controller and drive circuitry configured to energize the electromagnets to achieve a desired positioning of each movable optical component.

19. The optical apparatus as claimed in claim 18, wherein the one or more movable optical components form part of an illumination system configured to condition the beam and deliver it to a target location on a patterning device, and the movable component is movable to vary an incidence angle of the conditioned beam at the target location.

20. A lithographic apparatus, comprising:
an illumination system configured to condition a radiation beam;
a support constructed to support a patterning device, the patterning device capable of imparting the radiation beam with a pattern in its cross-section to form a patterned radiation beam;
a substrate table constructed to hold a substrate;
a projection system configured to project the patterned radiation beam onto a target portion of the substrate; and
an optical apparatus comprising,
  a series of optical components arranged to receive a radiation beam from a radiation source to process and deliver the beam to a target location, wherein the optical components include one or more movable optical components mounted on an actuator mechanism comprising,
    a moving part and a static part, the moving part including a magnet that is driven to move across a working range by magnetic fields generated by the static part; and
    a shield surrounding the working range of the magnet to reduce propagation of magnetic fields, the shield being formed of a ferromagnetic material and having therein at least one interruption; and
  a controller and drive circuitry configured to energize the electromagnets to achieve a desired positioning of each movable optical component,
wherein the optical apparatus is configured to condition the radiation beam in the illumination system and/or the patterned radiation beam in the projection system.

* * * * *

UNITED STATES PATENT AND TRADEMARK OFFICE
CERTIFICATE OF CORRECTION

PATENT NO. : 9,927,711 B2  
APPLICATION NO. : 15/105343  
DATED : March 27, 2018  
INVENTOR(S) : Hol et al.

Page 1 of 1

It is certified that error appears in the above-identified patent and that said Letters Patent is hereby corrected as shown below:

In Claim 16, Column 30, Line 51, after "array", please delete ";" and insert --,--.

Signed and Sealed this
Thirty-first Day of July, 2018

Andrei Iancu
*Director of the United States Patent and Trademark Office*